(12) United States Patent
Mori et al.

(10) Patent No.: US 10,892,319 B2
(45) Date of Patent: Jan. 12, 2021

(54) SEMICONDUCTOR DEVICE

(71) Applicant: ROHM CO., LTD., Kyoto (JP)

(72) Inventors: Seigo Mori, Kyoto (JP); Masatoshi Aketa, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/316,957

(22) PCT Filed: Jul. 27, 2017

(86) PCT No.: PCT/JP2017/027320
§ 371 (c)(1),
(2) Date: Jan. 10, 2019

(87) PCT Pub. No.: WO2018/034127
PCT Pub. Date: Feb. 22, 2018

(65) Prior Publication Data
US 2020/0020765 A1 Jan. 16, 2020

(30) Foreign Application Priority Data
Aug. 19, 2016 (JP) ................. 2016-161486

(51) Int. Cl.
*H01L 29/06* (2006.01)
*H01L 29/16* (2006.01)
(Continued)

(52) U.S. Cl.
CPC ...... *H01L 29/0623* (2013.01); *H01L 29/1608* (2013.01); *H01L 29/7395* (2013.01); *H01L 29/78* (2013.01)

(58) Field of Classification Search
CPC .................. H01L 29/0623; H01L 29/47
See application file for complete search history.

(56) References Cited

U.S. PATENT DOCUMENTS

| 7,989,910 B2* | 8/2011 | Saito | ................. | H01L 29/0615 |
| | | | | 257/492 |
| 8,395,162 B2* | 3/2013 | Nakano | ................. | H01L 21/049 |
| | | | | 257/77 |

(Continued)

FOREIGN PATENT DOCUMENTS

| JP | S5465477 | 5/1979 |
| JP | H0523547 | 3/1993 |

(Continued)

OTHER PUBLICATIONS

International Preliminary Report on Patentability issued for International Patent Application No. PCT/JP2017/027320, dated Feb. 28, 2019, 22 pages including English translation.

(Continued)

*Primary Examiner* — Eugene Lee
(74) *Attorney, Agent, or Firm* — Hamre, Schumann, Mueller & Larson., P.C.

(57) ABSTRACT

[Object] To provide a semiconductor device which can achieve not only satisfactory switching characteristics in both a small current region and a large current region but also a satisfactory reverse withstand voltage.
[Solution Means] A semiconductor device is provided that includes a semiconductor layer having a front surface, a back surface on a side opposite thereto, and an end surface, an MIS transistor structure which is formed on a front surface portion of the semiconductor layer, a first conductivity type portion and a second conductivity type portion which are formed adjacent to each other on the side of the back surface of the semiconductor layer, and a first electrode which is formed on the back surface of the semiconductor layer, which forms a Schottky junction with the first conductivity type portion and which is in ohmic contact with the second conductivity type portion.

31 Claims, 36 Drawing Sheets

(51) Int. Cl.
H01L 29/739 (2006.01)
H01L 29/78 (2006.01)

(56) References Cited

U.S. PATENT DOCUMENTS

| | | | |
|---|---|---|---|
| 8,860,039 B2* | 10/2014 | Miura | H01L 29/0615 |
| | | | 257/77 |
| 10,123,443 B2 | 11/2018 | Nakamura et al. | |
| 2007/0235768 A1 | 10/2007 | Nakazawa et al. | |
| 2008/0315248 A1* | 12/2008 | Tokura | H01L 27/0664 |
| | | | 257/139 |
| 2009/0134405 A1 | 5/2009 | Ota et al. | |
| 2009/0236697 A1* | 9/2009 | Ono | H01L 29/0634 |
| | | | 257/618 |
| 2012/0211762 A1 | 8/2012 | Imada et al. | |
| 2012/0211768 A1 | 8/2012 | Yoshikawa | |
| 2014/0001487 A1 | 1/2014 | Nakazawa et al. | |
| 2014/0225126 A1* | 8/2014 | Aketa | H01L 29/0804 |
| | | | 257/77 |
| 2014/0357026 A1 | 12/2014 | Kobayashi et al. | |
| 2014/0374774 A1 | 12/2014 | Tanaka et al. | |
| 2015/0021657 A1 | 1/2015 | Ogura et al. | |
| 2015/0060884 A1 | 3/2015 | Ota et al. | |
| 2015/0060938 A1 | 3/2015 | Lu | |
| 2015/0179784 A1 | 6/2015 | Nakazawa et al. | |
| 2015/0221731 A1* | 8/2015 | Zeng | H01L 29/7395 |
| | | | 257/139 |
| 2015/0228717 A1 | 8/2015 | Hara | |
| 2015/0228726 A1 | 8/2015 | Ogura et al. | |
| 2015/0333190 A1 | 11/2015 | Aketa et al. | |
| 2015/0340443 A1 | 11/2015 | Wada et al. | |
| 2016/0079349 A1 | 3/2016 | Wada et al. | |
| 2016/0189955 A1 | 6/2016 | Horii et al. | |
| 2016/0192495 A1 | 6/2016 | Nakamura et al. | |
| 2016/0343803 A1 | 11/2016 | Aketa et al. | |
| 2017/0040420 A1* | 2/2017 | Mori | H01L 27/04 |
| 2017/0054017 A1* | 2/2017 | Takaki | H01L 29/66068 |
| 2017/0162564 A1 | 6/2017 | Aketa et al. | |
| 2018/0158915 A1* | 6/2018 | Mori | H01L 29/0623 |
| 2019/0311917 A1 | 10/2019 | Mori et al. | |
| 2020/0020765 A1 | 1/2020 | Mori et al. | |

FOREIGN PATENT DOCUMENTS

| | | |
|---|---|---|
| JP | H05315490 | 11/1993 |
| JP | H06236990 | 8/1994 |
| JP | H11265976 | 9/1999 |
| JP | 2003197831 | 7/2003 |
| JP | 2004095572 | 3/2004 |
| JP | 2005183891 | 7/2005 |
| JP | 2007305609 A | 11/2007 |
| JP | 2008041708 | 2/2008 |
| JP | 2009094433 A | 4/2009 |
| JP | 2009123914 A | 6/2009 |
| JP | 2009130266 | 6/2009 |
| JP | 2012174831 A | 9/2012 |
| JP | 2012256662 | 12/2012 |
| JP | 2013110373 A | 6/2013 |
| JP | 2013219194 | 10/2013 |
| JP | 2015023118 A | 2/2015 |
| JP | 2015032789 A | 2/2015 |
| JP | 2015050394 | 3/2015 |
| JP | 2015099932 | 5/2015 |
| JP | 2015153784 | 8/2015 |
| JP | 20150220437 A | 12/2015 |
| WO | 2012124190 | 9/2012 |
| WO | 2012124190 A1 | 9/2012 |
| WO | 2013018760 | 2/2013 |
| WO | 2013141221 | 9/2013 |
| WO | 2014041652 A1 | 3/2014 |
| WO | 2014087601 | 6/2014 |
| WO | 2014091961 | 6/2014 |
| WO | 2014210072 | 12/2014 |
| WO | 2015159953 A1 | 10/2015 |
| WO | 2015166608 | 11/2015 |

OTHER PUBLICATIONS

International Search Report issued for International Patent Application No. PCT/JP2017/027320, dated Oct. 10, 2017, 7 pages including English translation.

International Search Report issued for International Patent Application No. PCT/JP2016/086369, dated Mar. 7, 2017, 7 pages including English translation.

International Preliminary Report on Patentability issued for International Patent Application No. PCT/JP2016/086369, dated Jun. 21, 2018, 42 pages including English translation.

* cited by examiner

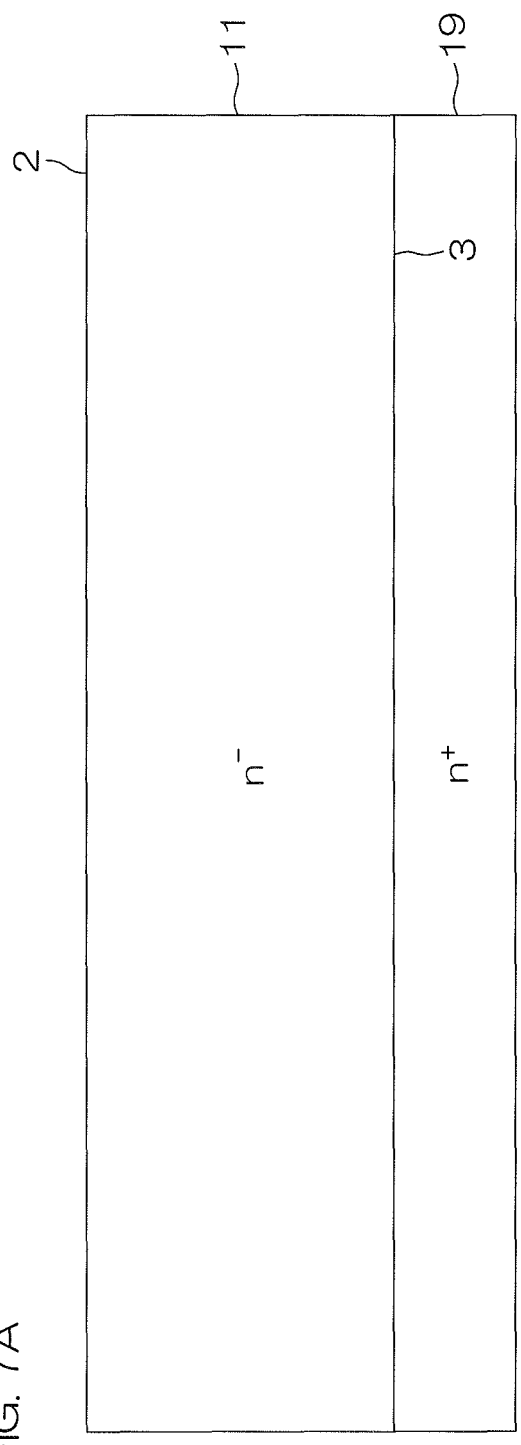

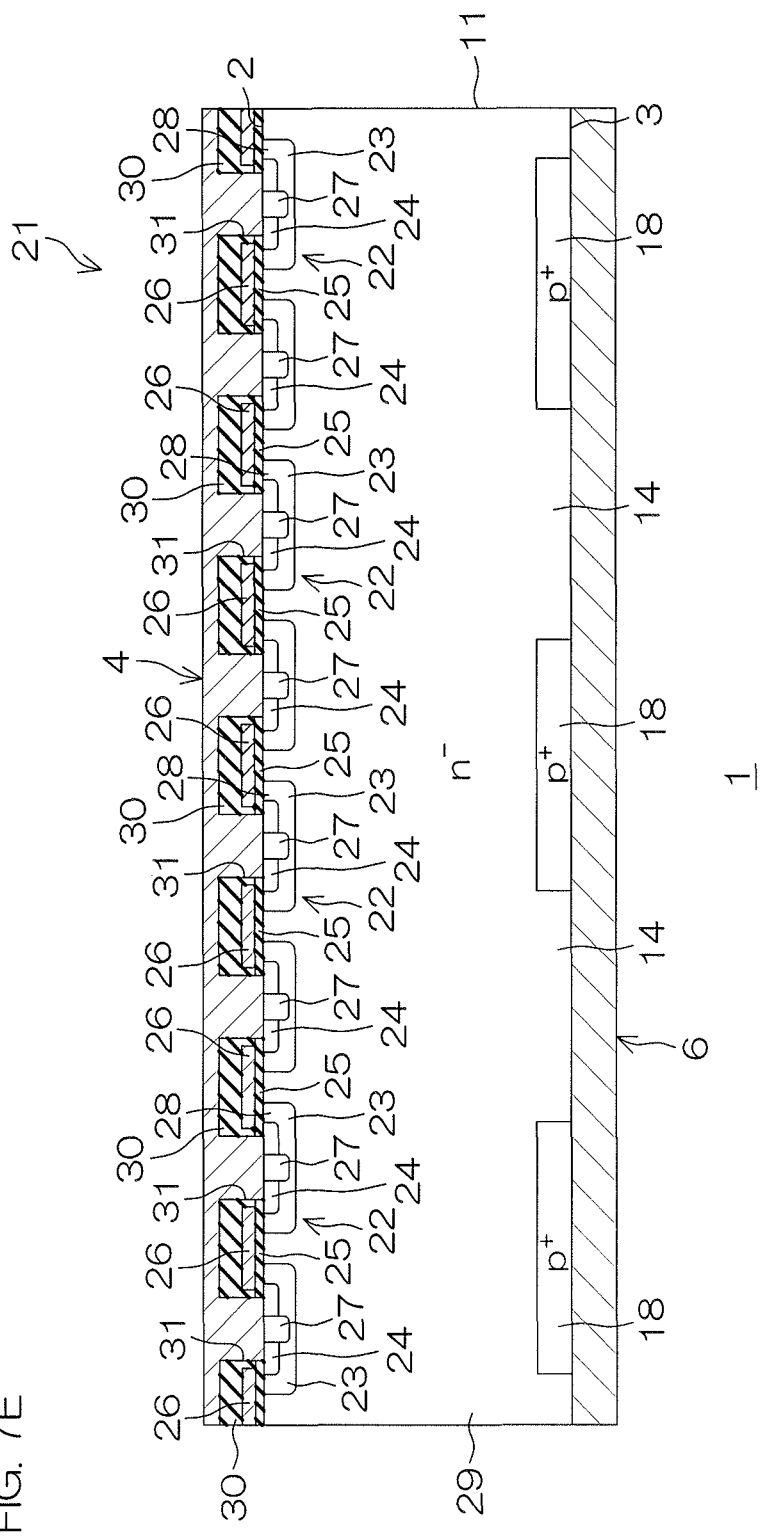

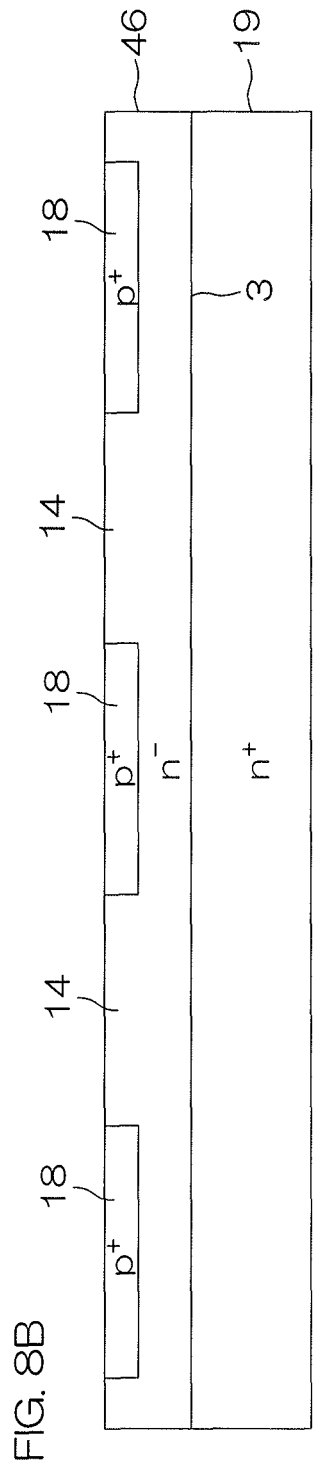

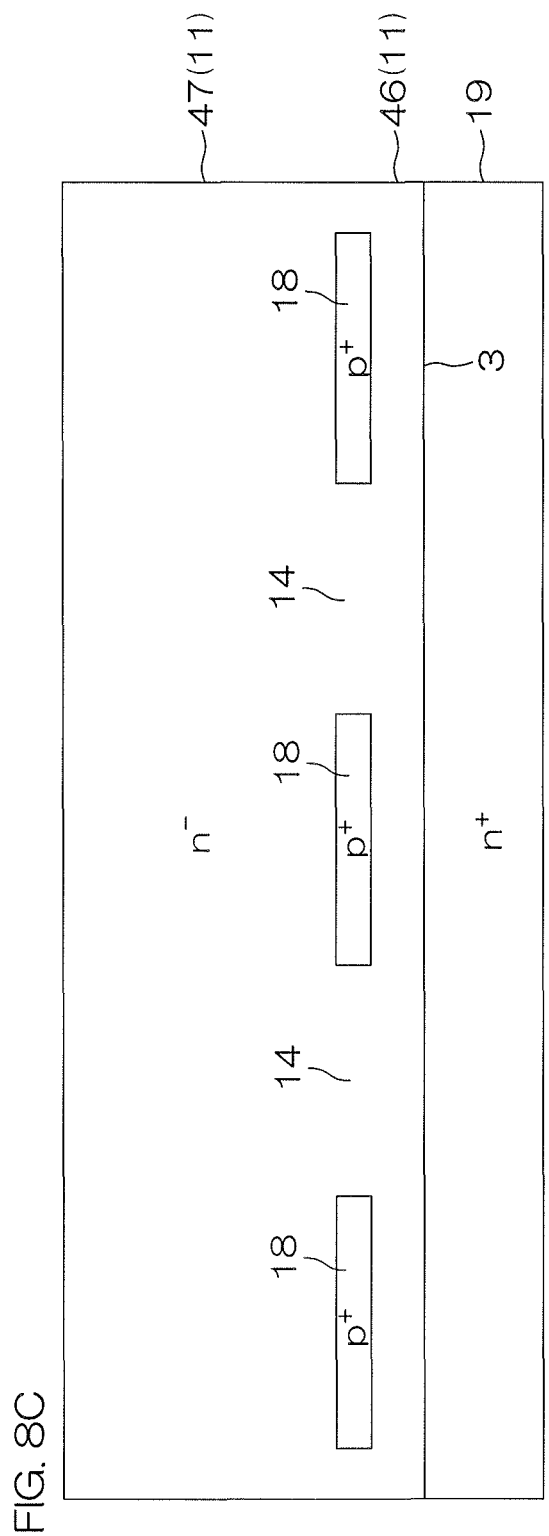

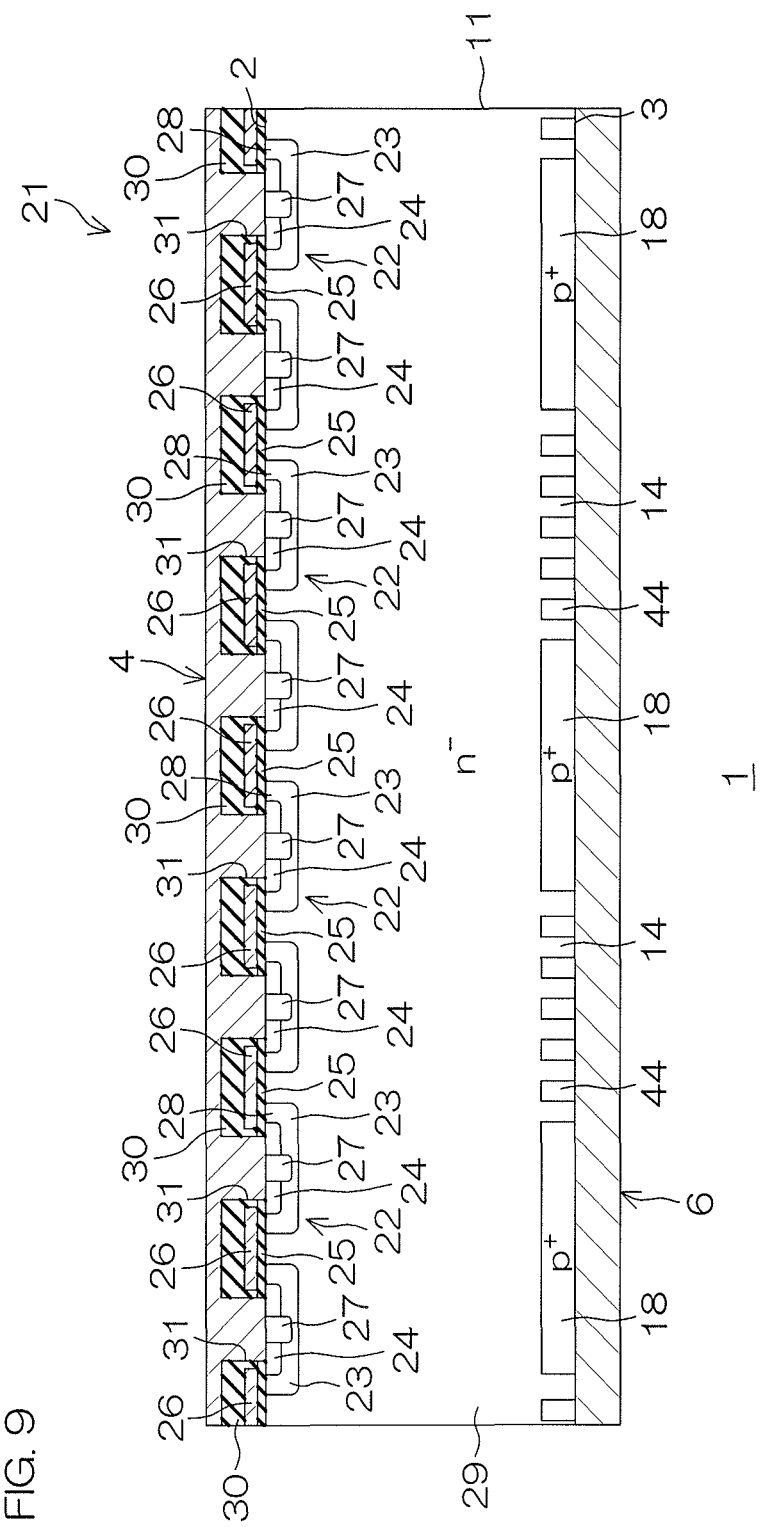

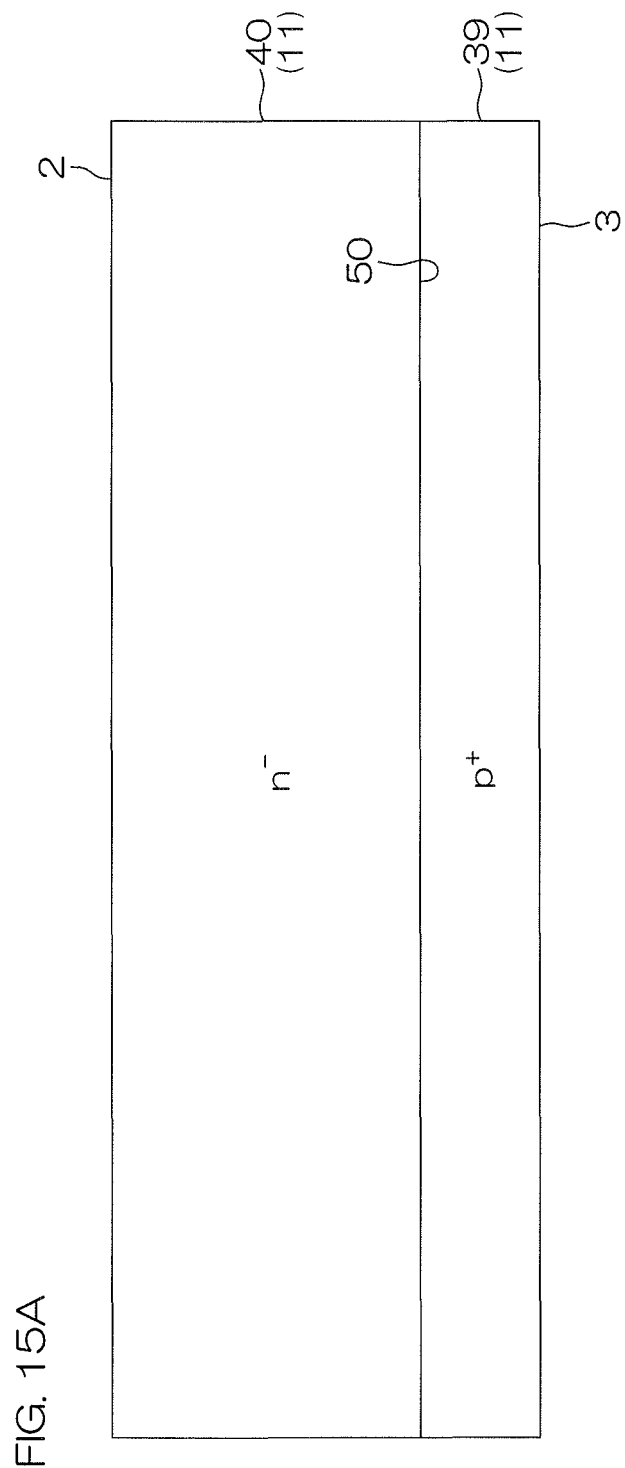

SEMICONDUCTOR DEVICE

TECHNICAL FIELD

The present invention relates to a semiconductor device.

BACKGROUND ART

In recent years, in order to achieve satisfactory switching characteristics in both a small current region and a large current region, a so-called hybrid MOSFET has been proposed which has not only a MOSFET function but also an IGBT function by selectively providing a p type collector region on the side of the back surface of a vertical n-channel MOSFET. This type of hybrid MOSFET is disclosed in, for example, Patent Literatures 1 and 2.

CITATION LIST

Patent Literature

Patent Literature 1: Japanese Patent Application Publication No. 2013-110373
Patent Literature 2: WO 2015/159953

SUMMARY OF INVENTION

Technical Problem

In Patent Literatures 1 and 2, due to the hybrid function of the MOSFET and the IGBT, in both the small current region and in the large current region, satisfactory switching characteristics can be achieved.

On the other hand, since a back surface electrode is brought into ohmic contact with both an $n^+$ type drain region and a $p^+$ type collector region which are formed on the side of the back surface of a substrate, a structure is provided in which when a reverse voltage is applied to a transistor structure, a current flows, with the result that reverse withstand voltage is not provided.

An object of the present invention is to provide a semiconductor device which can achieve not only satisfactory switching characteristics in both a small current region and a large current region but also a satisfactory reverse withstand voltage.

Solution to Problem

A semiconductor device according to a preferred embodiment of the present invention includes a semiconductor layer having a front surface, a back surface on a side opposite thereto, and an end surface, an MIS transistor structure which is formed on a front surface portion of the semiconductor layer, a first conductivity type portion and a second conductivity type portion which are formed adjacent to each other on the side of the back surface of the semiconductor layer, and a first electrode which is formed on the back surface of the semiconductor layer, which forms a Schottky junction with the first conductivity type portion and which is in ohmic contact with the second conductivity type portion.

In this configuration, in the semiconductor device, for the MIS transistor structure, the first conductivity type portion and the second conductivity type portion respectively form the drain region of a MISFET (Metal Insulator Semiconductor Field Effect Transistor) and the collector region of an IGBT (Insulated Gate Bipolar Semiconductor). That is, for the common MIS transistor structure, by providing mutually different conductivity type electrode contact portions on the side of the back surface, the semiconductor device has a Hybrid-MIS (Hybrid-Metal Insulator Semiconductor) structure in which the MISFET and the IGBT are integrated into the same semiconductor layer.

The MISFET is effective as an element which is mainly used in a low withstand voltage region (for example, 5 kV or less). When the MISFET is brought into an on-state, a drain current rises from when a drain voltage is 0V, and then linearly increases with an increase in the drain voltage. Therefore, in the MISFET, satisfactory small current region characteristics can be achieved. On the other hand, since the drain current linearly increases with an increase in the drain voltage, in a case where the MISFET is used in a large current region, the area of the semiconductor layer needs to be increased according to an increase in the drain voltage applied.

On the other hand, the IGBT is effective as an element which is mainly used in a high withstand voltage region (for example, 10 kV or more). In a case of the IGBT, the conductivity modulation characteristics of a bipolar transistor are provided, and thus large-current control can be performed with high withstand voltage. Therefore, in the IGBT, satisfactory large current region characteristics can be achieved without increasing the area of the semiconductor layer.

From the above, by integrating the MISFET and the IGBT into the same semiconductor layer, it is possible to realize a wide operating range from the low withstand voltage region to the high withstand voltage region. That is, it is possible to provide the semiconductor device in which, while it is useable as a high withstand voltage element, in the small current region, the MISFET (bipolar) operation can be realized, and in the large current region, the IGBT (bipolar) operation can be realized. Consequently, it is possible to achieve satisfactory switching characteristics in both the small current region and the large current region.

Also, in the semiconductor device according to the preferred embodiment of the present invention, for example, when a reverse voltage is applied to the MISFET structure, a current flows in the direction of thickness within the semiconductor layer via a body diode (parasitic diode) formed with a pn junction within the MIS transistor structure. However, with the structure of the present invention, the current can be prevented by a Schottky barrier formed between the first conductivity type portion and the first electrode. Consequently, it is possible to ensure a satisfactory reverse withstand voltage.

In the semiconductor device according to the preferred embodiment of the present invention, the semiconductor layer may include a first conductivity type semiconductor layer, the first conductivity type portion may include a back surface portion of the first conductivity type semiconductor layer, and the second conductivity type portion may include a second conductivity type impurity region which is selectively formed on the back surface portion of the first conductivity type semiconductor layer.

In the semiconductor device according to the preferred embodiment of the present invention, the semiconductor layer may include a first conductivity type first semiconductor layer and a second conductivity type second semiconductor layer which is formed on the side of a back surface of the first semiconductor layer, in the second conductivity type layer, a trench having a bottom portion that reaches the first conductivity type layer may be selectively formed, the first conductivity type portion may include aback surface portion of the first conductivity type layer which is exposed to the bottom portion of the trench, and the second conductivity type portion may be formed with the second conductivity type layer.

In the semiconductor device according to the preferred embodiment of the present invention, the MIS transistor structure may include a second conductivity type body region, a first conductivity type source region which is formed on a front surface portion of the body region, a gate insulating film which is formed such that the gate insulating film is in contact with at least part of the body region and the source region, a gate electrode which faces the body region across the gate insulating film, an interlayer insulating film which is formed such that the interlayer insulating film covers an upper portion and a side portion of the gate electrode, and a source electrode which is connected to the source region and formed over the interlayer insulating film, a first conductivity type drift region is arranged on the side of the back surface of the semiconductor layer with respect to the body region in the semiconductor layer, and the drift region may include a drain region at a region which is connected to the first electrode.

In the semiconductor device according to the preferred embodiment of the present invention, the semiconductor layer may include an electric field relaxation region which is selectively formed on the side of a back surface of the first conductivity type portion in an active region where the MIS transistor structure is formed and which is formed with a high resistance region having a resistance higher than the drift region or the second conductivity type impurity region.

In this configuration, an electric field in the Schottky interface between the drift region and the first electrode (drain electrode) can be relaxed. Accordingly, a reverse leakage current can be reduced even when a metal whose work function is relatively small is used as the first electrode, therefore, by using the metal, a low on-resistance can be ensured.

In the semiconductor device according to the preferred embodiment of the present invention, in a case where the semiconductor layer is formed of SiC, the electric field relaxation region may include the high resistance region which has a crystal defect concentration of $1\times10^{14}$ cm$^{-3}$ to $1\times10^{22}$ cm$^{-3}$ or may include the second conductivity type impurity region which has an impurity concentration of $1\times10^{16}$ cm$^{-3}$ to $1\times10^{19}$ cm$^{-3}$.

In the semiconductor device according to the preferred embodiment of the present invention, the first conductivity type portion may include a flat portion which is substantially uniform on the side of the back surface of the semiconductor layer and the electric field relaxation region may be formed in the flat portion.

In the semiconductor device according to the preferred embodiment of the present invention, the first conductivity type portion may selectively include the trench on the side of the back surface of the semiconductor layer, and the electric field relaxation region may be formed along an inner surface of the trench.

In the semiconductor device according to the preferred embodiment of the present invention may further include a first conductivity type field stop region which is formed on at least the side of the front surface and the side of the back surface of the semiconductor layer and which has an impurity concentration higher than the drift region. In this case, the field stop region may be arranged at a depth position away from the front surface or the back surface of the semiconductor layer or may be formed such that the field stop region reaches the front surface or the back surface of the semiconductor layer.

In this configuration, when a voltage is applied between the source and the drain, it is possible to prevent a depletion layer extending from a low voltage side from reaching a conductive pattern (for example, the MIS transistor structures) on a high voltage side. Accordingly, it is possible to prevent a leakage current caused by a punch-through phenomenon.

In the semiconductor device according to the preferred embodiment of the present invention, the first conductivity type portion may have an impurity concentration of $1\times10^{14}$ cm$^{-3}$ to $1\times10^{17}$ cm$^{-3}$, and the first electrode may be formed of Ti, Ni, Mo, or Au.

In the semiconductor device according to the preferred embodiment of the present invention, the semiconductor layer may further include a front surface terminal structure which is formed in a surrounding region of the active region where the MIS transistor structure is formed.

In the semiconductor device according to the preferred embodiment of the present invention, the first electrode may include a peripheral edge in a position separated inward from the end surface of the semiconductor layer, and the semiconductor layer may further include a back surface terminal structure which is formed on the side of the back surface of the semiconductor layer in the surrounding region of the active region where the MIS transistor structure is formed and which is arranged such that the back surface terminal structure overlaps a peripheral edge portion of the first electrode.

In this configuration, since the back surface terminal structure overlaps the peripheral edge portion of the first electrode, when the reverse voltage is applied, it is possible to prevent the depletion layer from reaching the end surface (chip end surface) of the semiconductor layer. Accordingly, even when a defect region is present on the end surface of the semiconductor layer due to dicing, it is also possible to prevent the flow of a leakage current caused by the generation of electron-hole pairs.

In the semiconductor device according to the preferred embodiment of the present invention, the back surface terminal structure may include an inner peripheral edge which is on an inner side with respect to the peripheral edge of the first electrode and an outer peripheral edge which is on an outer side with respect to the peripheral edge of the first electrode and which is in a position separated inward from the end surface of the semiconductor layer.

In the semiconductor device according to the preferred embodiment of the present invention, the back surface terminal structure may be formed with a plurality of parts which include at least one part that overlaps the peripheral edge portion of the first electrode or may be formed such that the back surface terminal structure reaches the end surface of the semiconductor layer.

In the semiconductor device according to the preferred embodiment of the present invention, the semiconductor layer may further include a surrounding electric field relaxation region which is formed such that the surrounding electric field relaxation region reaches the back surface from the front surface of the semiconductor layer in the surrounding region of the active region where the MIS transistor structure is formed and which is formed with a high resistance region having a resistance higher than the semiconductor layer or the second conductivity type impurity region.

In this configuration, since the surrounding electric field relaxation region is formed around the MIS transistor structure, even when the depletion layer is extended toward the end surface (chip end surface) of the semiconductor layer at the time of application of the reverse voltage, the depletion layer can be stopped in the surrounding electric field relaxation region, with the result that it is possible to prevent the depletion layer from reaching the end surface. Consequently, it is possible to relax the intensity of the electric field near the end surface of the semiconductor layer. Therefore, even when a defect region is present on the end surface of the semiconductor layer due to dicing, it is also possible to prevent the flow of a leakage current caused by the generation of electron-hole pairs.

In the semiconductor device according to the preferred embodiment of the present invention, in a case where the semiconductor layer is formed of SiC, the surrounding electric field relaxation region may include the high resistance region which has a crystal defect concentration of $1 \times 10^{14}$ cm$^{-3}$ to $1 \times 10^{22}$ cm$^{-3}$ or may include the second conductivity type impurity region which has an impurity concentration of $1 \times 10^{18}$ cm$^{-3}$ to $1 \times 10^{22}$ cm$^{-3}$.

In the semiconductor device according to the preferred embodiment of the present invention, the surrounding electric field relaxation region may be formed such that the surrounding electric field relaxation region is spaced inward from the end surface of the semiconductor layer and to surround the active region.

In the semiconductor device according to the preferred embodiment of the present invention, the semiconductor layer may include a first conductivity type surrounding impurity region between the surrounding electric field relaxation region and the end surface of the semiconductor layer, the first electrode may be in contact with the surrounding impurity region on the back surface of the semiconductor layer, and the semiconductor device may include an auxiliary electrode which is in contact with the surrounding impurity region on the front surface of the semiconductor layer and which is electrically connected to the first electrode.

In this configuration, the potential of the surrounding impurity region is fixed to the same potential from the front surface to the back surface of the semiconductor layer. Accordingly, it is possible to make it difficult to extend the electric field to the surrounding electric impurity region, and thus it is possible to further relax the intensity of the electric field near the semiconductor layer.

In the semiconductor device according to the preferred embodiment of the present invention, the auxiliary electrode may be formed such that the auxiliary electrode straddles a boundary portion between the surrounding electric field relaxation region and the surrounding impurity region, and may be in contact with both the surrounding electric field relaxation region and the surrounding impurity region.

In the semiconductor device according to the preferred embodiment of the present invention, the surrounding electric field relaxation region may be formed such that the surrounding electric field relaxation region reaches the end surface of the semiconductor layer.

In the semiconductor device according to the preferred embodiment of the present invention, the second conductivity type portion may have a minimum width $W_{min}$ which is equal to or more than one cell width in the MIS transistor structure or may have the minimum width $W_{min}$ which is twice or more of the thickness of the semiconductor layer.

In the semiconductor device according to the preferred embodiment of the present invention, a plurality of the second conductivity type portions may be arranged in the shape of stripes in plan view, or the plurality of the second conductivity type portions may be respectively formed in the shape of a polygon or in the shape of a circle in plan view and arranged discretely.

A semiconductor package according to a preferred embodiment of the present invention includes the semiconductor device, a lead frame on which the semiconductor device is mounted, and a sealing resin which seals at least part of the semiconductor device and the lead frame.

In a power conversion device according to a preferred embodiment of the present invention, the semiconductor device is used as a bidirectional switch, and for example, the bidirectional switch is used as a switch circuit of a matrix converter circuit which converts from a polyphase input to a polyphase output.

BRIEF DESCRIPTION OF DRAWINGS

FIG. 7A is a diagram showing part of a manufacturing process of the semiconductor device in FIG. 1 to FIG. 4.

FIG. 7E is a diagram showing a step subsequent to FIG. 7D.

FIG. 8B is a diagram showing a step subsequent to FIG. 8A.

FIG. 8C is a diagram showing a step subsequent to FIG. 8B.

FIG. 9 is a diagram for illustrating electric field relaxation regions formed in a Schottky interface of the semiconductor device.

FIG. 15A is a diagram showing part of a manufacturing process of the semiconductor device in FIG. 14.

DESCRIPTION OF EMBODIMENTS

Preferred embodiments of the present invention will be described in detail below with reference to accompanying drawings.

Figure 1:
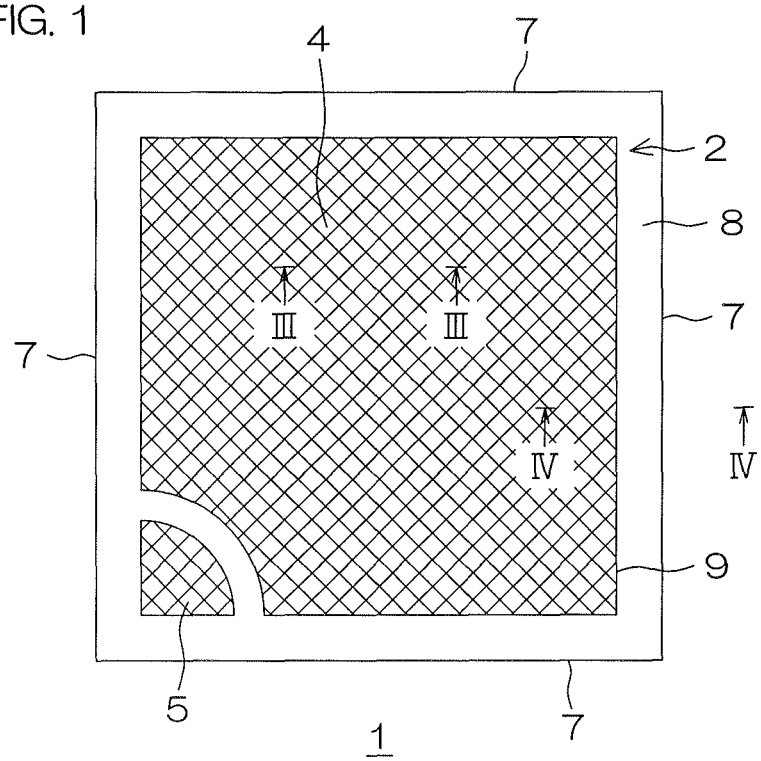
FIG. 1 is a schematic plan view of a semiconductor device according to a preferred embodiment of the present invention.
Figure 2:
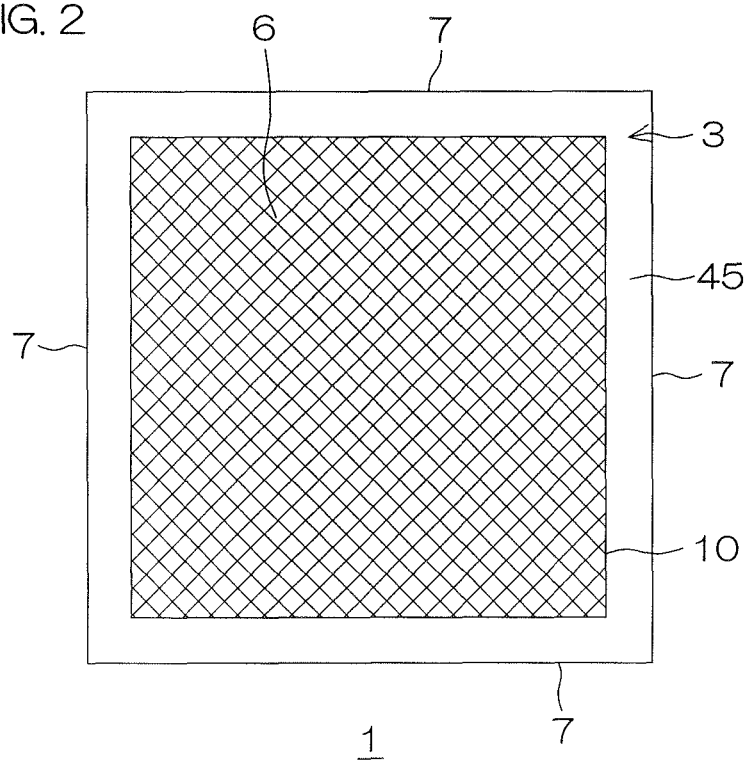
FIG. 2 is a schematic bottom view of the semiconductor device according to the preferred embodiment of the present invention.

FIG. 1 and FIG. 2 are respectively a plan view and a bottom view of a semiconductor device 1 according to the preferred embodiment of the present invention.

The semiconductor device 1 includes a source electrode 4 and a gate pad 5 on the side of the front surface 2 thereof, and also includes a drain electrode 6 as an example of a first electrode in the present invention on the side of a back surface 3.

The source electrode 4 is formed substantially in the shape of a quadrangle over a substantially entire region of a front surface 2, and includes a peripheral edge 9 in a position separated inward from an end surface 7 of the semiconductor device 1. In the peripheral edge 9, as will also be described later, a front surface terminal structure such as a guard ring, etc., is provided. Accordingly, on the front surface 2 of the semiconductor device 1, a semiconductor region 8 is exposed around the source electrode 4. In this preferred embodiment, the semiconductor region 8 surrounding the source electrode 4 is exposed. The gate pad 5 is provided in one corner portion of the source electrode 4 such that the gate pad 5 is spaced from the source electrode 4, and is connected to a gate electrode 26 in each of MIS transistor structures 22 which will be described later.

As will also be described later, the drain electrode 6 is formed substantially in the shape of a quadrangle over a substantially entire region of the back surface 3, and includes a peripheral edge 10 in a position separated inward from the end surface 7 of the semiconductor device 1. Accordingly, on the back surface 3 of the semiconductor device 1, a semiconductor region 45 is exposed around the drain electrode 6. In this preferred embodiment, the semiconductor region 45 surrounding the drain electrode 6 is exposed.

Figure 3:
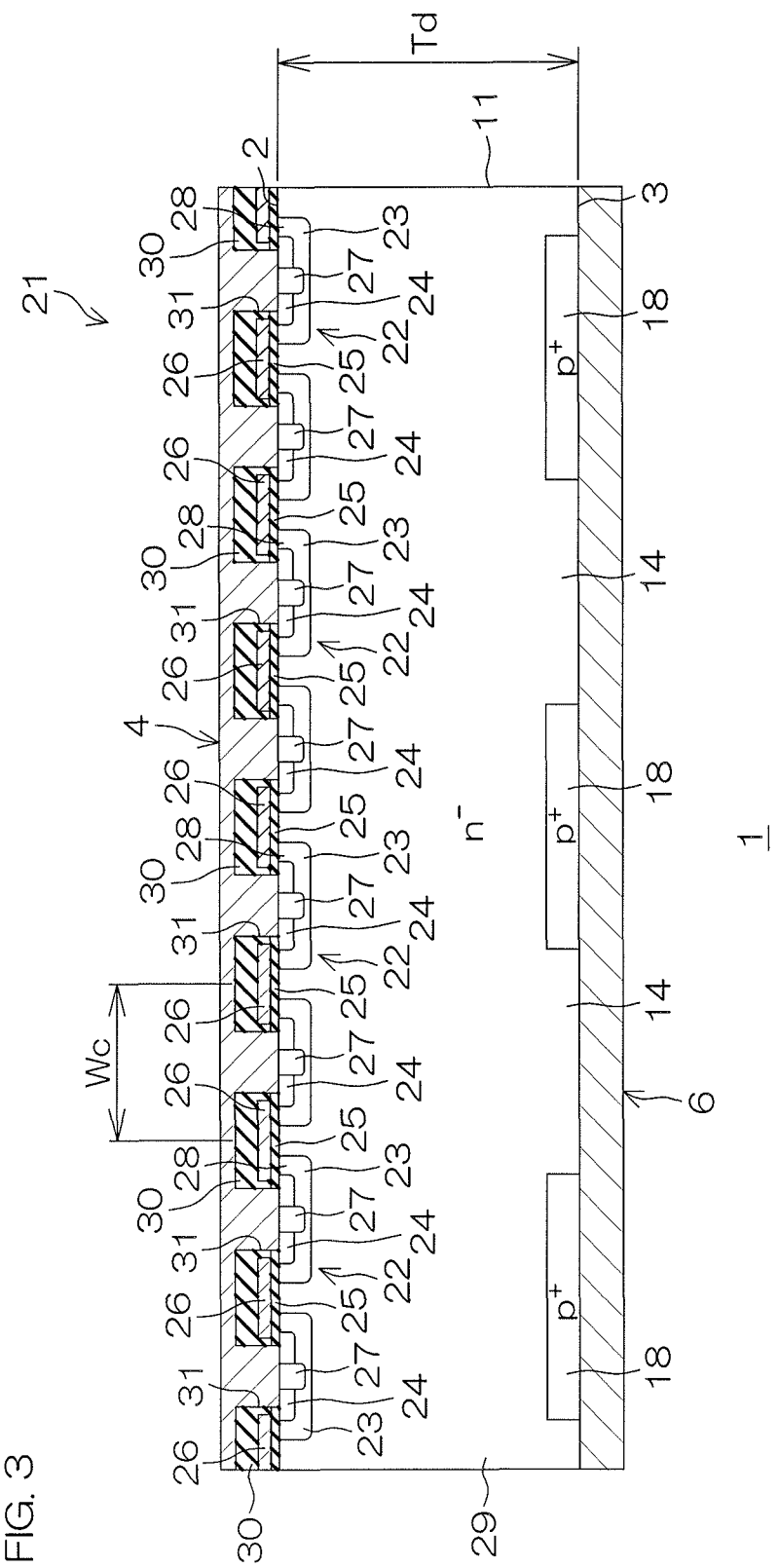
FIG. 3 is a cross-sectional view presented when the semiconductor device is cut along line III-III in FIG. 1.
Figure 4:
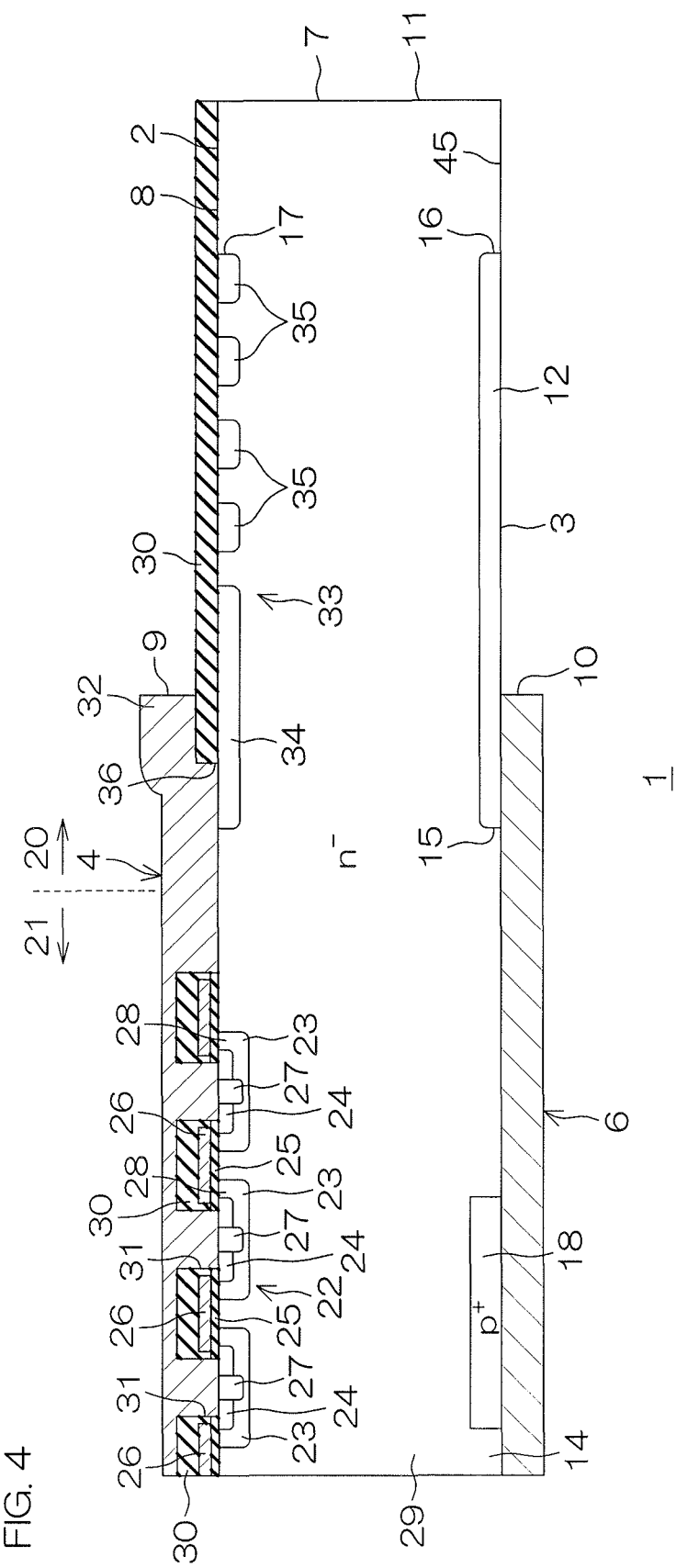
FIG. 4 is a cross-sectional view presented when the semiconductor device is cut along line IV-IV in FIG. 1.
Figure 5C:
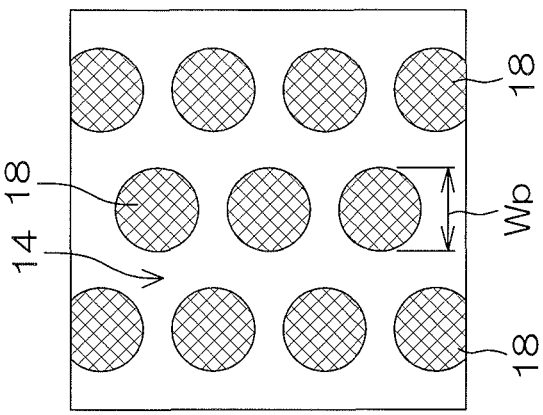
FIG. 5A to FIG. 5C are diagrams showing arrangement patterns of p$^+$ type regions.
Figure 5B:
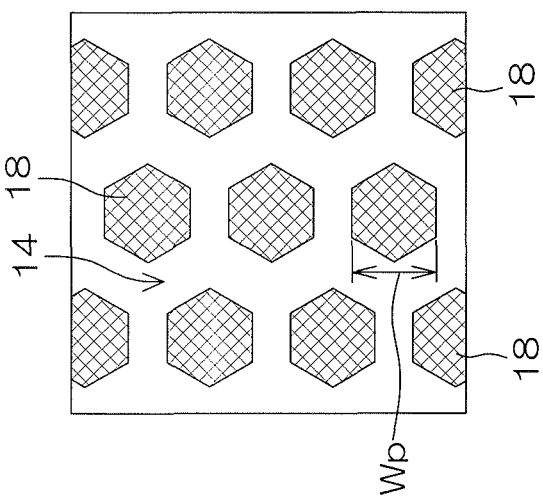
Figure 5A:
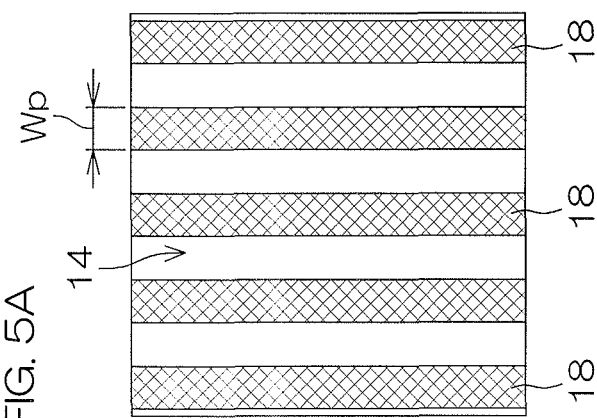

FIG. 3 and FIG. 4 are respectively cross-sectional views presented when the semiconductor device 1 is cut along line III-III and line IV-IV in FIG. 1. FIG. 5A to FIG. 5C are diagrams showing arrangement patterns of $p^+$ type regions 18 when seen from the side of the back surface.

The semiconductor device 1 includes a semiconductor layer 11 formed of type SiC. The semiconductor layer 11 includes the front surface 2 which is the Si surface of the SiC, the back surface 3 which is the C surface of the SiC on the side opposite thereto, and the end surface 7 which is extended in a direction intersecting the front surface 2 (in FIG. 3 and FIG. 4, which is extended in a vertical direction). The front surface 2 may be a surface other than the Si surface of the SiC, and the back surface 3 may be a surface other than the C surface of the SiC.

The semiconductor layer 11 has, for example, a thickness of 10 μm to 250 μm. Also, the semiconductor device 1 generally has a substantially uniform n type impurity concentration, and has, for example, an impurity concentration of $1 \times 10^{14}$ cm$^{-3}$ to $1 \times 10^{17}$ cm$^{-3}$. Here, "having a substantially uniform impurity concentration" means that the semiconductor layer 11 does not have, on a back surface portion (for example, a region which is extended a certain distance from the back surface 3 in the direction of thickness), an n type part (for example, an $n^+$ type part) of a relatively high impurity concentration.

On the back surface portion of the semiconductor layer 11, the $p^+$ type regions 18 serving as an example of second conductivity type portions in the present invention are selectively formed. On the other hand, on the back surface portion of the semiconductor layer 11, the regions other than the $p^+$ type regions 18 are exposed from the back surface 3 as $n^+$ type regions 14 serving as an example of first conductivity type portions in the present invention.

As shown in FIG. 3 and FIG. 4, the $p^+$ type regions 18 are formed over a substantially entire semiconductor layer 11 (that is, in both an active region 21 and an outer peripheral region 20 which will be described later).

The $p^+$ type regions 18 can be formed into various patterns. For example, as indicated by hatching in FIG. 5A, a plurality of the $p^+$ type regions 18 may be arranged in plan view (bottom view) in the shape of stripes. As indicated by hatching in FIG. 5B, the plurality of the $p^+$ type regions 18 may be respectively formed in the shape of polygons (in FIG. 5B, in the shape of regular hexagons) in plan view and may be arranged discretely. Although in FIG. 5B, the plurality of the $p^+$ type regions 18 are arranged in a staggered configuration, they may be arranged in a matrix configuration. As indicated by hatching in FIG. 5C, the plurality of the $p^+$ type regions 18 may be respectively formed in the shape of circles (in FIG. 5C, in the shape of regular circles) in plan view and may be arranged discretely. As a matter of course, the arrangement pattern of FIG. 5C may have a matrix configuration as in the case of FIG. 5B. It is noted that, although in FIG. 5A to FIG. 5C, the plurality of the $p^+$ type regions 18 are unified having the same shape, they may differ in shape and size.

The semiconductor device 1 includes the outer peripheral region 20 which is set in a peripheral edge portion (part near the end surface 7) and the active region 21 which is surrounded by the outer peripheral region 20.

On a front surface portion of the semiconductor layer 11 in the active region 21, a plurality of the MIS transistor structures 22 are formed. The MIS transistor structure 22 includes a p type body region 23, an $n^+$ type source region 24, a gate insulating film 25, the gate electrode 26, and a $p^+$ type body contact region 27.

More specifically, a plurality of the p type body regions 23 are formed on the front surface portion of the semiconductor layer 11. The respective p type body regions 23 form the minimum units (unit cells) through which a current flows in the active region 21. The $n^+$ type source region 24 is formed in the inner region of each of the p type body region 23. The $n^+$ type source region 24 is exposed to the front surface 2 of the semiconductor layer 11. In the p type body region 23, the outer region of the $n^+$ type source region 24 (region surrounding the $n^+$ type source region 24) defines a channel region 28. The gate electrode 26 straddles adjacent unit cells, and faces the channel region 28 via the gate insulating film 25. The $p^+$ type body contact region 27 penetrates through the $n^+$ type source region 24. The $p^+$ type body contact region 27 is electrically connected to the p type body region 23.

A description will be given of the respective portions of the MIS transistor structure 22. The impurity concentration of the p type body region 23 is, for example, $1\times10^{16}$ cm$^{-3}$ to $1\times10^{19}$ cm$^{-3}$, the impurity concentration of the $n^+$ type source region 24 is, for example, $1\times10^{19}$ cm$^{-3}$ to $1\times10^{21}$ cm$^{-3}$, and the impurity concentration of the $p^+$ type body contact region 27 is, for example, $1\times10^{19}$ cm$^{-3}$ to $1\times10^{21}$ cm$^{-3}$. The gate insulating film 25 is formed of, for example, silicon oxide (SiO$_2$), and the thickness thereof is 20 nm to 100 nm. The gate electrode 26 is formed of, for example, polysilicon.

Also, in FIG. 3, when the distance between the gate electrodes 26 of adjacent MIS transistor structures 22 is assumed to be one cell width Wc in the MIS transistor structure 22, a width Wp of each of the $p^+$ type regions 18 in FIG. 5A to FIG. 5C is preferably equal to or more than the cell width Wc. Alternatively, as shown in FIG. 3, when the thickness of the semiconductor layer 11 is assumed to be Td, the width Wp of each of the $p^+$ type regions 18 may be twice or more of the thickness Td. Accordingly, positive holes are efficiently injected from the respective $p^+$ type regions 18, and thus it is possible to make a transition to an IGBT mode at a low drain voltage. It is noted that, as shown in FIG. 5A to FIG. 5C, as the width Wp, it suffices to measure the narrowest part of each of the $p^+$ type regions 18.

In the semiconductor layer 11, an $n^+$ type region on the side of the back surface 3 with respect to the MIS transistor structure 22 is an $n^+$ type drift region 29, and parts thereof are exposed to the back surface 3 as the above-described $n$ type regions 14.

On the side of the front surface of the semiconductor layer 11, an interlayer insulating film 30 which straddles both the active region 21 and the outer peripheral region 20 is formed. The interlayer insulating film 30 is formed of, for example, silicon oxide (SiO$_2$), and the thickness thereof is 0.5 µm to 3.0 µm. In the interlayer insulating film 30, a contact hole 31 is formed through which the $n^+$ type source region 24 and the $p^+$ type body contact region 27 in each unit cell are exposed.

On the interlayer insulating films 30, the source electrode 4 is formed. The source electrode 4 enters the respective contact holes 31 such that the source electrode 4 is in ohmic contact with the $n^+$ type source regions 24 and the $p^+$ type body contact regions 27. The source electrode 4 is extended from the active region 21 to the outer peripheral region 20, and includes, in the outer peripheral region 20, an overlap portion 32 which rides on the interlayer insulating film 30.

As shown in FIG. 4, on the front surface portion of the semiconductor layer 11 in the outer peripheral region 20, a front surface terminal structure 33 is formed. The front surface terminal structure 33 may be formed with a plurality of parts which include at least one part that overlaps the peripheral edge portion of the source electrode 4 (peripheral edge portion of a junction portion to the semiconductor layer 11). In FIG. 4, an innermost resurf layer 34 (RESURF: Reduced Surface Field) and a plurality of guard ring layers 35 which surround the resurf layer 34 are included. The resurf layer 34 is formed such that the resurf layer 34 straddles the interior and the exterior of an opening 36 of the interlayer insulating film 30, and is brought into contact with the peripheral edge portion of the source electrode 4 within the opening 36. A plurality of the guard ring layers 35 are spaced from each other. Although the resurf layer 34 and the guard ring layers 35 shown in FIG. 4 are formed with a p type impurity region, they may be formed with a high resistance region. In a case of the high resistance region, the resurf layer 34 and the guard ring layers 35 may have a crystal defect concentration of $1\times10^{14}$ cm$^{-3}$ to $1\times10^{22}$ cm$^{-3}$.

On the back surface 3 of the semiconductor layer 11, the drain electrode 6 is formed. The drain electrode 6 is an electrode which is common to a plurality of unit cells. On the back surface 3 of the semiconductor layer 11, the drain electrode 6 forms a Schottky junction with the $n^-$ type regions 14 (the $n^-$ type drift region 29), and is in ohmic contact with the $p^+$ type regions 18. The drain electrode 6 is formed of a metal (for example, Ti, Ni Mo, or Au, etc.) which can form a Schottky junction with the $n^-$ type regions 14 and which can be in ohmic contact with the $p^+$ type regions 18.

Also, the drain electrode 6 has the peripheral edge 10 in a position separated inward from the end surface 7 of the semiconductor layer 11. Accordingly, the semiconductor region 45 is exposed to the back surface 3 of the semiconductor layer 11 around the drain electrode 6. In this preferred embodiment, the semiconductor region 45 which surrounds the drain electrode 6 is exposed. The peripheral edge portion of the drain electrode 6 faces the peripheral edge portion of the source electrode 4 across the semiconductor layer 11. More specifically, the drain electrode 6 is extended from the active region 21 to the outer peripheral region 20 and includes the peripheral edge portion arranged directly below the front surface terminal structure 33 (in this preferred embodiment, the resurf layer 34) in the outer peripheral region 20. As shown in FIG. 4, the drain electrode 6 may have the same size as the source electrode 4.

On the back surface portion of the semiconductor layer 11 in the outer peripheral region 20, a back surface terminal structure 12 is formed. The back surface terminal structure 12 includes an inner side peripheral edge 15 which is on an inner side with respect to the peripheral edge 10 of the drain electrode 6 and an outer side peripheral edge 16 which is on an outer side with respect to the peripheral edge 10 of the drain electrode 6 and which is in a position separated inward from the end surface 7 of the semiconductor layer 11. In this preferred embodiment, the formation range of the back surface terminal structure 12 is substantially the same as that of the front surface terminal structure 33. Therefore, the outer side peripheral edge 16 of the back surface terminal structure 12 may coincide with the outer side peripheral edge 17 of the outermost guard ring layer 35 in plan view.

The back surface terminal structure 12 may be a high resistance region which has a resistance higher than the n⁻ type drift region 29 or may be a p type impurity region. In a case of the high resistance region, the back surface terminal structure 12 may have a crystal defect concentration of $1\times10^{14}$ cm$^{-3}$ to $1\times10^{22}$ cm$^{-3}$. On the other hand, in a case of the p type impurity region, the back surface terminal structure 12 may have an impurity concentration of $1\times10^{16}$ cm$^{-3}$ to $1\times10^{19}$ cm$^{-3}$.

In this semiconductor device 1, the n⁻ type region 14 (the n⁻ type drift region 29) and the p⁺ type region 18 are exposed to the side of the back surface 3 of the semiconductor layer 11, and the drain electrode 6 which is the common electrode is in contact with both thereof. Therefore, for the MIS transistor structure 22, the n⁻ type drift region 29 and the p⁺ type region 18 respectively form the drain region of a MISFET (Metal Insulator Semiconductor Field Effect Transistor) and the collector region of an IGBT (Insulated Gate Bipolar Semiconductor). That is, for the common MIS transistor structure 22, by providing mutually different conductivity type electrode contact portions on the side of the back surface, the semiconductor device 1 has a Hybrid-MIS (Hybrid-Metal Insulator Semiconductor) structure in which the MISFET and the IGBT are integrated into the same semiconductor layer.

Figure 6A:
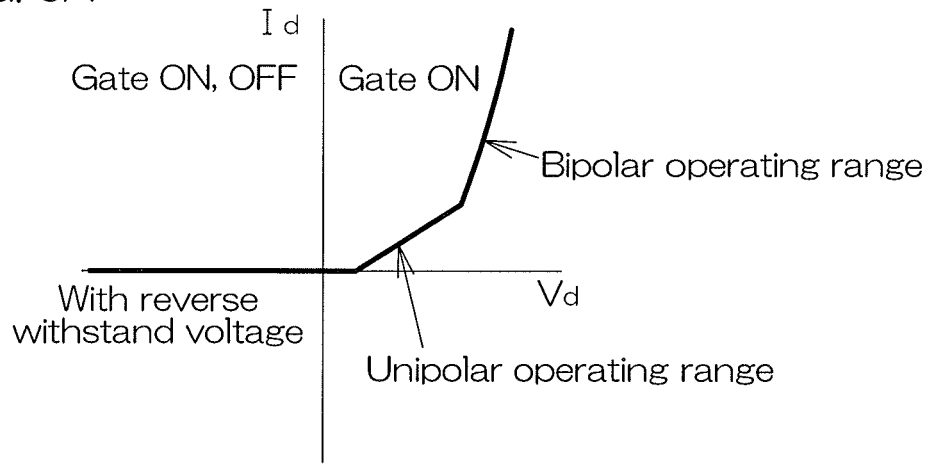
FIG. 6A to FIG. 6C are diagrams showing I-V curves in the semiconductor device according to the preferred embodiment of the present invention and in a semiconductor device according to a comparative example.

The MISFET is effective as an element which is mainly used in a low withstand voltage region (for example, 5 kV or less). Therefore, in the semiconductor device 1, when a voltage is applied between the source and the drain, and a voltage which is equal to or more than a threshold voltage is applied to the gate electrode 26, the MISFET is first turned on, and thus electrical continuity is established between the source electrode 4 and the drain electrode 6 via the n⁻ type region 14 of the semiconductor layer 11 (MISFET mode). For example, as shown in FIG. 6A, a drain current Id linearly increases with an increase in a drain voltage Vd until the drain voltage Id rises from when a source-drain voltage Vd is 0V and then pinch-off occurs. Therefore, in the MISFET, satisfactory characteristics in the small current region can be achieved. On the other hand, since the drain voltage Vd increases with an increase in the drain current Id, when the MISFET is used in a large current region, a current-carrying loss in the MISFET which is determined by the product of the drain voltage Vd and the drain current Id is increased. It is noted that, by increasing the area of the semiconductor layer, the drain voltage Vd necessary for the flow of a large current can be reduced and consequently, the current-carrying loss in the MISFET can be reduced. However, the manufacturing cost is significantly increased.

On the other hand, the IGBT is effective as an element which is mainly used in a high withstand voltage region (for example, 10 kV or more). In this semiconductor device 1, after electrical continuity is established between the source and the drain in the MISFET mode, when, as shown in FIG. 6A, the source-drain voltage becomes equal to or more than a rising voltage Vpn of a parasitic diode (pn diode) formed with the pn junction of the p type body region 23 and the n⁻ type drift region 29, the semiconductor device 1 transitions to the large current region. In the large current region, electrons flow into the n⁻ type drift region 29. The electrons act as a base current for a pnp transistor which is formed with the p type body region 23, the n⁻ type drift region 29, and the p⁺ type region 18 (collector region), and thus electrical continuity is established in the pnp transistor. Since electrons are supplied from the n⁺ type source region 24 (emitter region), and positive holes are injected from the p⁺ type region 18, electrons and positive holes are excessively accumulated in the n⁻ type drift region 29. Accordingly, conductivity modulation occurs in the n⁻ type drift region 29, and thus the n⁻ type drift region 29 transitions to a high conductivity state and the IGBT is turned on. That is, via the p⁺ type region 18 of the semiconductor layer 11, electrical continuity is established between the source electrode 4 and the drain electrode 6 (IGBT mode). As above, in a case of the IGBT, the conductivity modulation characteristics of a bipolar transistor are provided, and thus large-current control can be performed with high withstand voltage. Therefore, in the IGBT, satisfactory large current region characteristics can be exhibited without increasing the area of the semiconductor layer as compared with the MISFET.

As above, by incorporating the MISFET and the IGBT into the same semiconductor layer, it is possible to realize a wide operating range from the low withstand voltage region to the high withstand voltage region. That is, it is possible to provide the semiconductor device in which, while it is useable as a high withstand voltage element, in the small current region, the MISFET (bipolar) operation can be realized, and in the large current region, the IGBT (bipolar) operation can be realized. Consequently, in the semiconductor device 1, satisfactory switching characteristics can be achieved in both the small current region and the large current region.

Also, in the semiconductor device 1, when a reverse voltage (in FIG. 6A, the region of Vd<0) is applied between the source and the drain, a current flows in the direction of thickness within the semiconductor device 1 via a body diode (parasitic diode) formed with the pn junction within the MIS transistor structure 22. However, with the structure of the present preferred embodiment, as shown in FIG. 6A, by a Schottky barrier formed between the n⁻ type region 14 and the drain electrode 6, it is possible to prevent the drain current Id from flowing. Consequently, it is possible to ensure a satisfactory reverse withstand voltage.

Figure 6B:
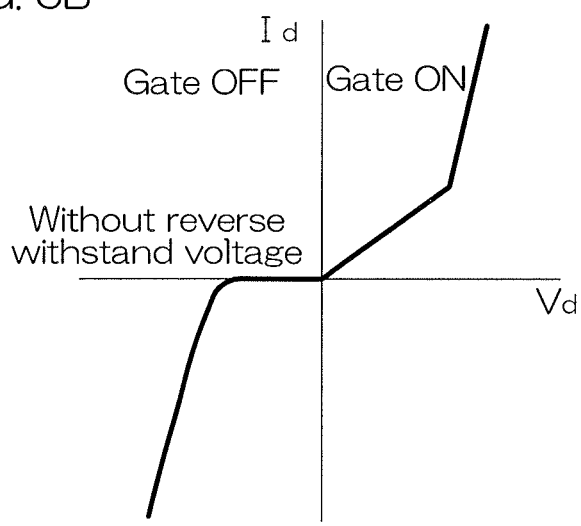
Figure 6C:
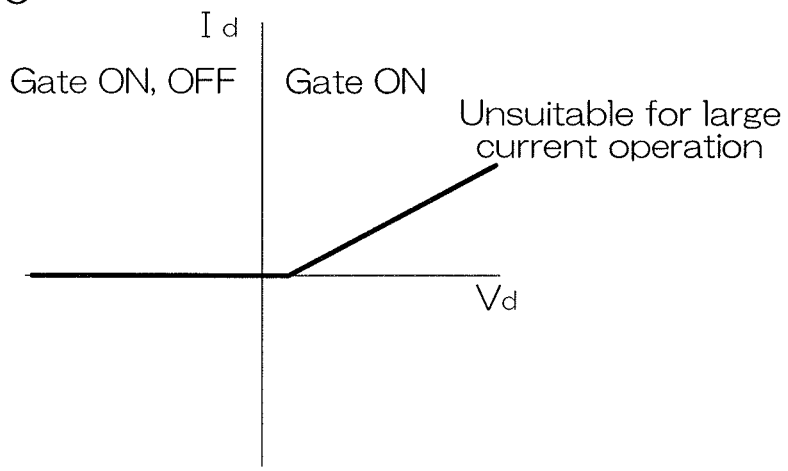

On the other hand, in the semiconductor device 1, when any one of the Schottky junctions of the p⁺ type region 18 and the n⁻ type region 14 with the drain electrode 6 is omitted, it is difficult to achieve any one of the satisfactory switching characteristics and the satisfactory reverse withstand voltage. For example, when the latter Schottky junction is omitted, and the drain electrode 6 is brought into ohmic contact with the n⁻ type drift region 29 via an n⁺ type region (not shown), etc., as shown in FIG. 6B, reverse electrical continuity is established. When the former p⁺ type region 18 is omitted, and the drain electrode 6 makes a Schottky junction with the n⁻ type drift region 29 over the entre back surface 3 of the semiconductor layer 11, conductivity modulation cannot be performed in the large current region, with the result that, as shown in FIG. 6C, in the large current region, it is difficult to realize the satisfactory switching characteristics.

A method of manufacturing the semiconductor device 1 will then be described with reference to FIG. 7A to FIG. 7E.

FIG. 7A to FIG. 7E are diagrams showing a manufacturing process of the semiconductor device 1 shown in FIG. 1 to FIG. 4 in order of steps.

In order to manufacture the semiconductor device 1, as shown in FIG. 7A, first, on a base substrate 19 in a state of a wafer which is formed of an n⁺ type SiC (for example, an impurity concentration is $1\times10^{18}$ cm$^{-3}$ to $1\times10^{20}$ cm$^{-3}$), by epitaxial growth, the semiconductor layer 11 which has a concentration lower than the base substrate 19 is formed. The thickness of the base substrate 19 may be, for example, 150 μm to 450 μm.

Figure 7B:
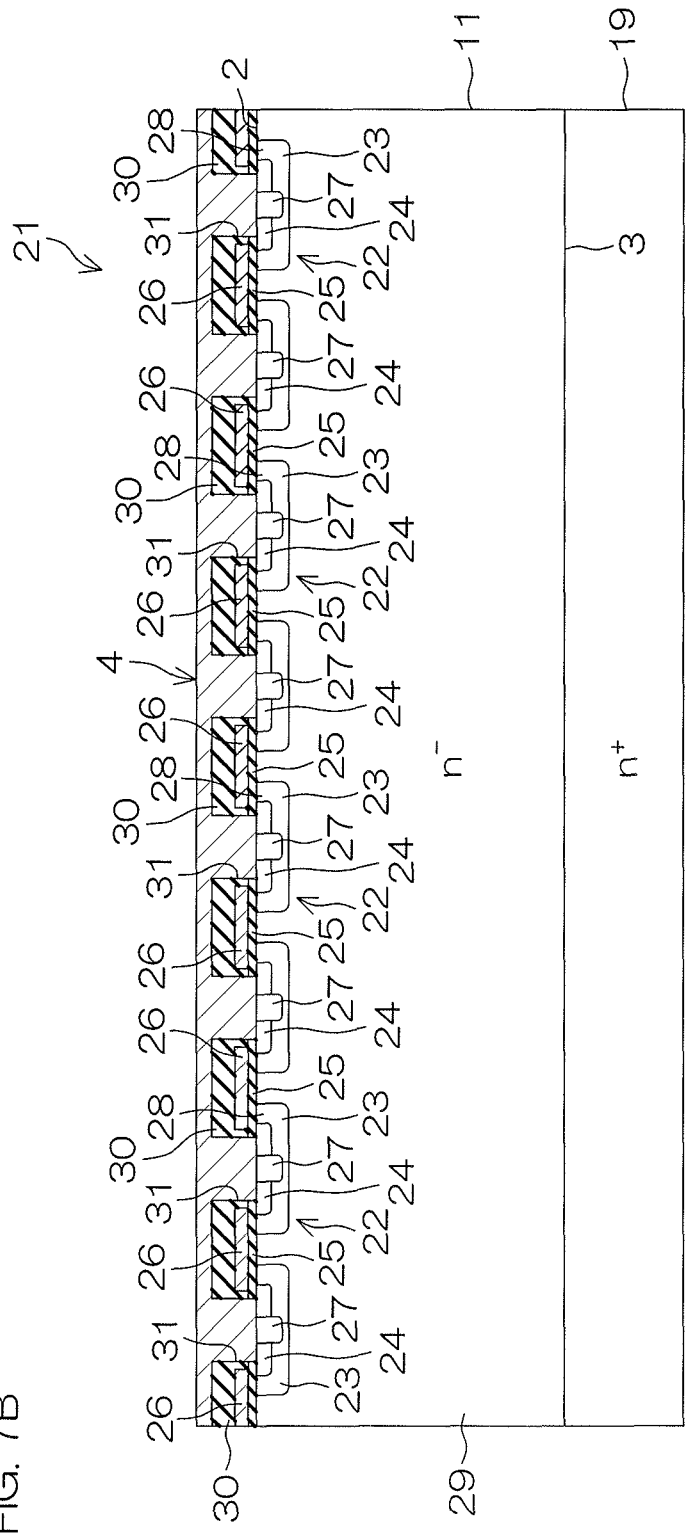
FIG. 7B is a diagram showing a step subsequent to FIG. 7A.

Next, as shown in FIG. 7B, on the front surface portion of the semiconductor layer 11, the above-described MIS transistor structures 22 are formed. Here, although not shown, when the front surface terminal structure 33 is formed by an ion implantation step for the formation of the p type body region 23 in the MIS transistor structure 22, the step thereof can be reduced. However, the front surface terminal structure may be formed in a separate step. Thereafter, the interlayer insulating films 30 and the source electrode 4 are formed.

Figure 7C:
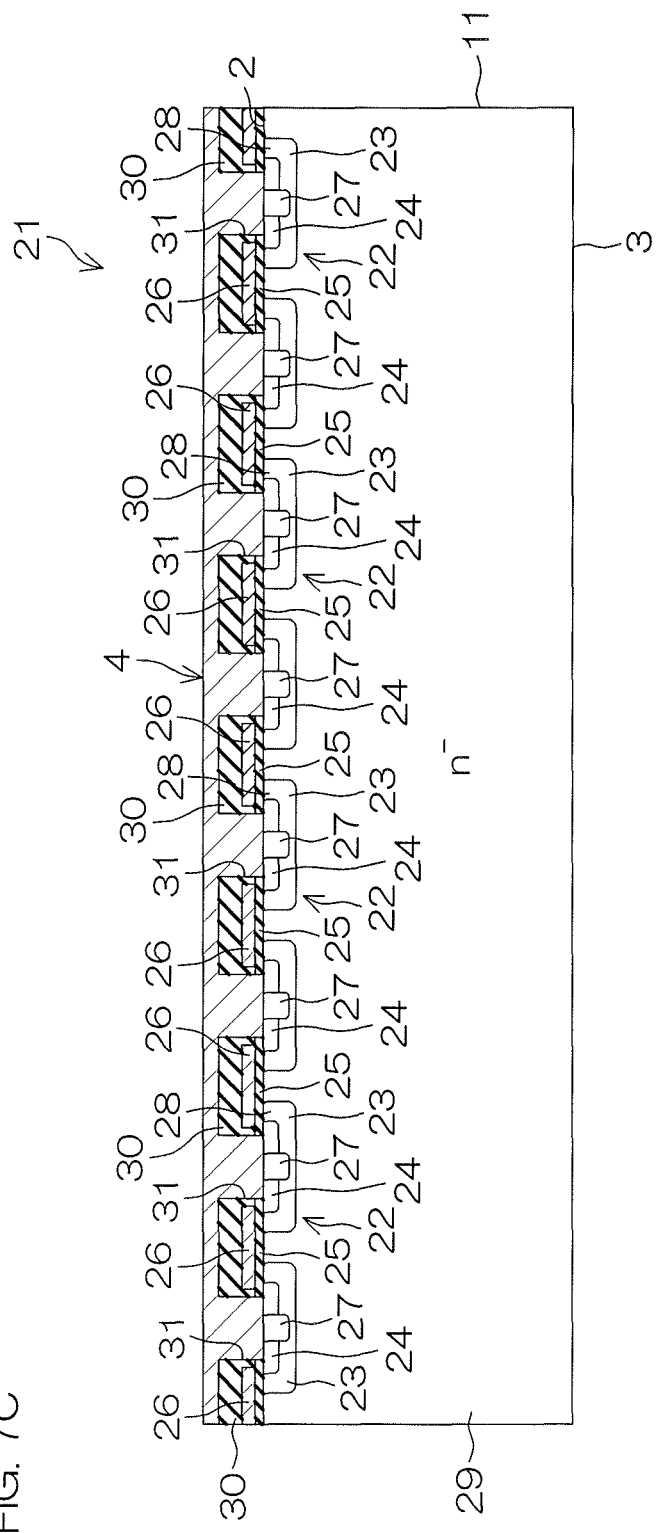
FIG. 7C is a diagram showing a step subsequent to FIG. 7B.

Next, as shown in FIG. 7C, by removing the base substrate 19, the entire back surface 3 of the semiconductor layer 11 is exposed. This step may be performed by removing the base substrate 19 almost completely by grinding from the side of the back surface 3 and thereafter polishing (for example, CMP) may be performed for finishing. In the polishing step, the semiconductor layer 11 which is exposed after being ground may be further thinned. Specifically, the base substrate 19 having a thickness of 350 μm may be removed by back surface grinding, and thereafter the semiconductor layer 11 having a thickness of 50 μm may be polished so as to have a thickness of 40 μm. By finally applying the polishing step, the surface state of the back surface 3 of the semiconductor layer 11 which is exposed can be made smooth, and thus the drain electrode 6 can be satisfactorily made to make the Schottky junction.

Figure 7D:
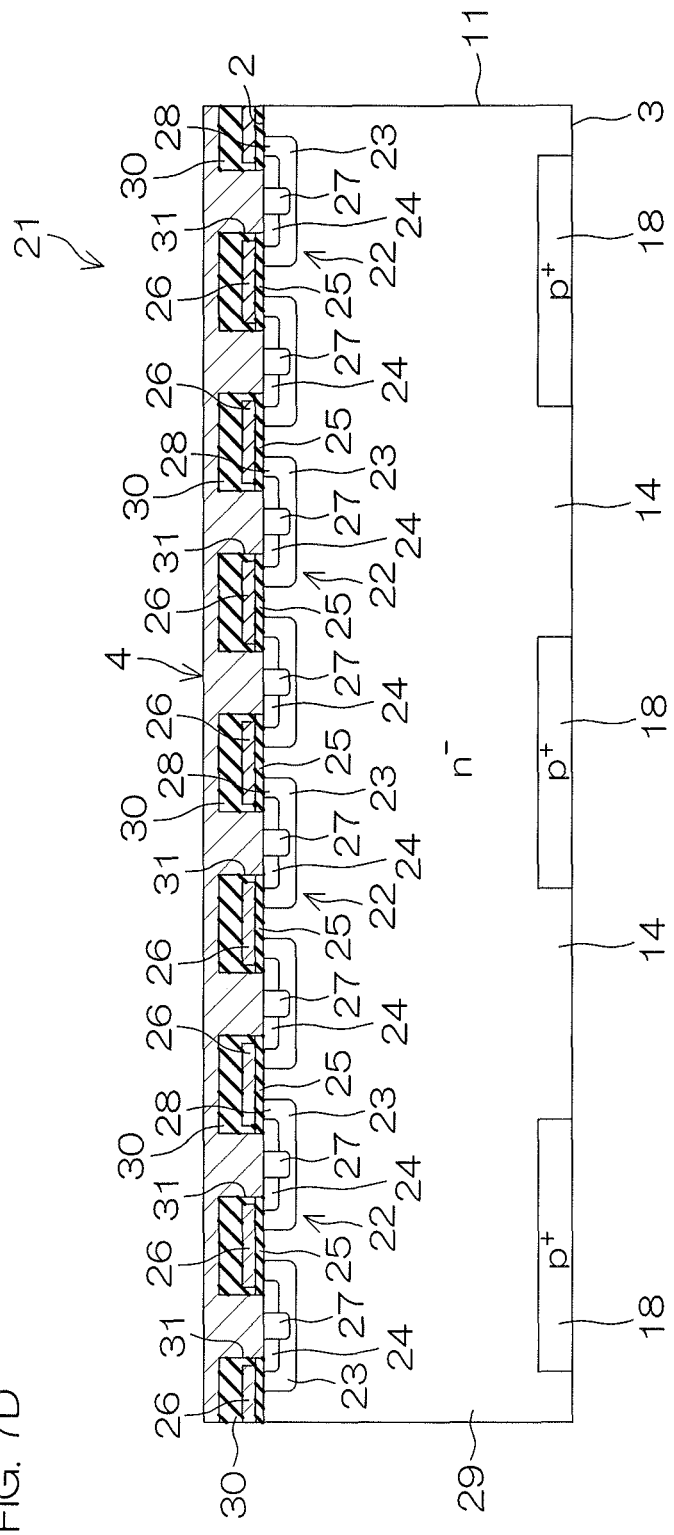
FIG. 7D is a diagram showing a step subsequent to FIG. 7C.

Next, as shown in FIG. 7D, a resist film (not shown) which selectively covers the back surface 3 of the semiconductor layer 11 is formed, and, via the resist film, p type impurity (for example, aluminum (Al)) ions are implanted into the back surface 3 of the semiconductor layer 11. Thereafter, by performing laser annealing, the p type impurity is activated, and thus the $p^+$ type regions 18 are formed. Here, although not shown, when the back surface terminal structure 12 is formed by the ion implantation step for the formation of the $p^+$ type region 18, the step thereof can be reduced. However, the back surface terminal structure 12 may be formed in a separate step.

Next, for example, by a sputtering method, a metal film is formed over the entire back surface 3 of the semiconductor layer 11, and the metal film is selectively removed (etched). Accordingly, the drain electrode 6 is formed. Then, the semiconductor layer 11 is cut along a dicing line which is set at a position away from the peripheral edge 10 (not shown in FIG. 7E) of the drain electrode 6. Accordingly, as shown in FIG. 7E, the semiconductor device 1 which is individualized can be obtained.

It is noted that, the semiconductor device 1 can also be manufactured, for example, in steps 8A to 8F instead of steps 7A to 7E.

Figure 8A:
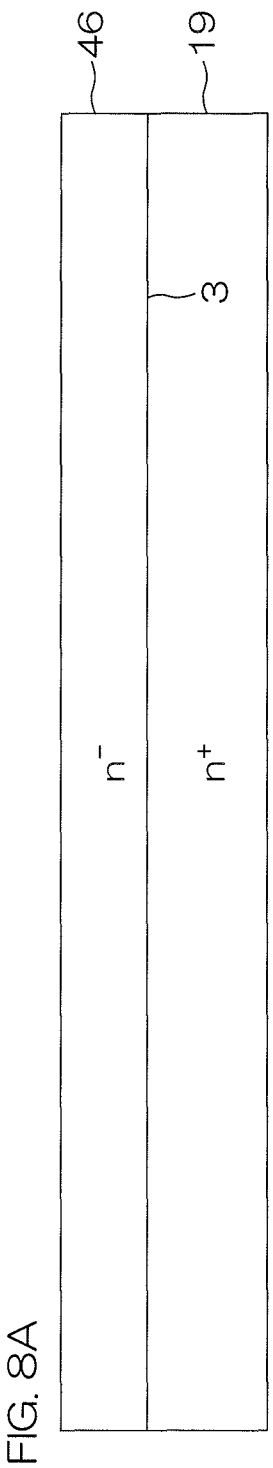
FIG. 8A is a diagram showing another form of the manufacturing process of the semiconductor device in FIG. 1 to FIG. 4.

Specifically, as shown in FIG. 8A, on the base substrate 19, by epitaxial growth, an n type first semiconductor layer 46 whose concentration is lower than that of the base substrate 19 is formed. The thickness of the first semiconductor layer 46 is, for example, 0.5 μm to 5 μm.

Next, as shown in FIG. 8B, the $p^+$ type regions 18 are formed in the first semiconductor layer 46. Specifically, p type impurity ions are selectively implanted into the front surface of the first semiconductor layer 46. Here, the $p^+$ type regions 18 do not need to be formed up to the back surface of the first semiconductor layer 46 (interface with the base substrate 19), as the p type impurity ions, for example, Al is used. Thereafter, by performing annealing processing, the $p^+$ type regions 18 are formed. When the annealing processing is performed, in both the base substrate 19 and the first semiconductor layer 46, elements which are sensitive to high temperature are not yet formed, and thus the annealing processing can be performed at a relatively high temperature (for example, 1500° C. to 1800° C.).

Next, as shown in FIG. 8C, on the first semiconductor layer 46, by further epitaxial growth, an $n^-$ type second semiconductor layer 47 is formed. The thickness of the second semiconductor layer 47 is, for example, 5 μm to 300 μm. Accordingly, the semiconductor layer 11 formed with the first semiconductor layer 46 and the second semiconductor layer 47 is formed. The $p^+$ type regions 18 formed on the front surface portion of the first semiconductor layer 46 are brought into a state where they are embedded in a bottom portion of the semiconductor layer 11.

Figure 8D:
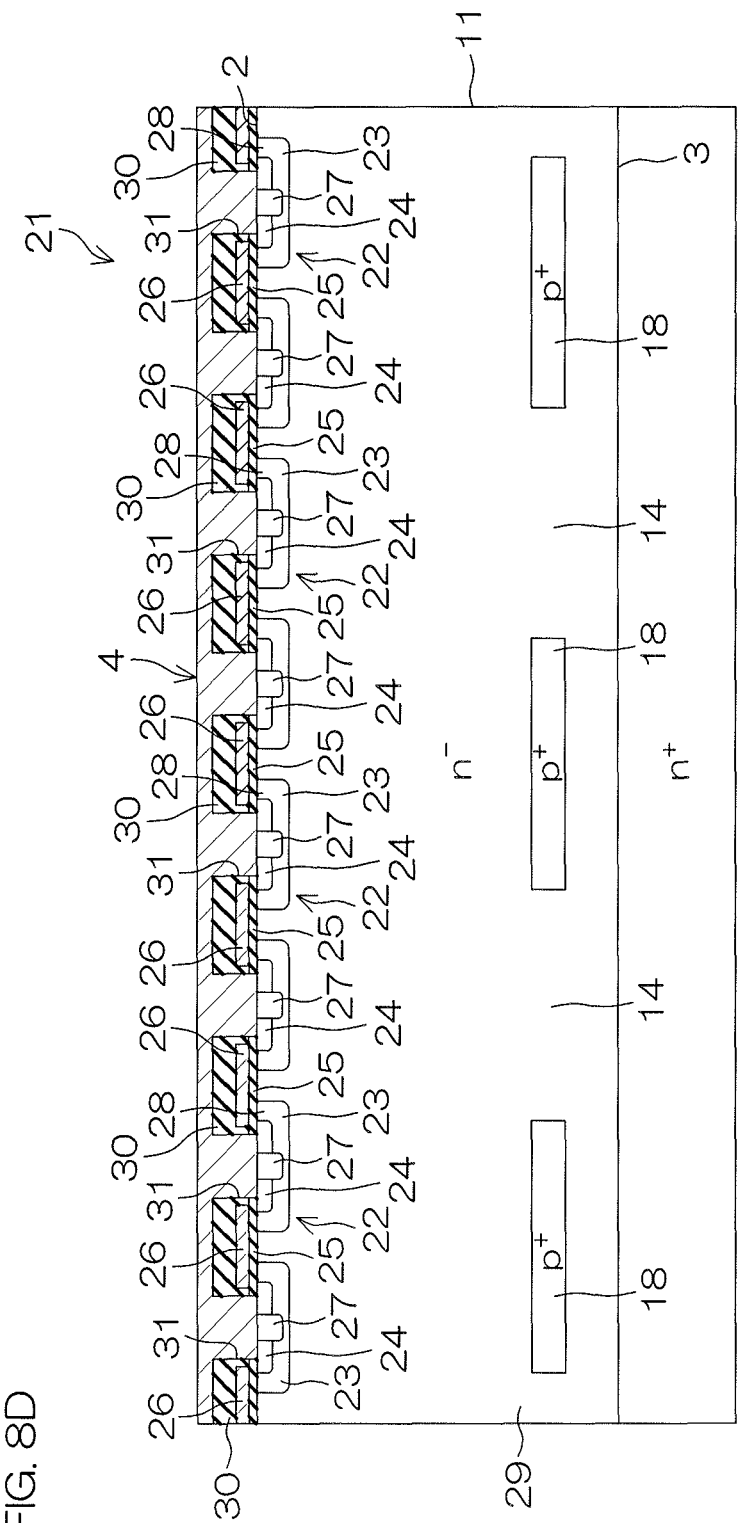
FIG. 8D is a diagram showing a step subsequent to FIG. 8C.

Next, as shown in FIG. 8D, by selectively implanting impurity ions from the side of the front surface 2 of the semiconductor layer 11, the impurity regions of the MIS transistor structure 22 and the front surface terminal structure 33 are formed. Specifically, the p type body regions 23, the $n^+$ type source regions 24, the $p^+$ type body contact regions 27, the resurf layer 34, and the guard ring layers 35 are formed. It is noted that, in the step of FIG. 8B, without performing annealing processing on the embedded $p^+$ type regions 18, the annealing processing for forming the impurity regions (such as the p type body regions 23, etc.) of the MIS transistor structures 22 may be utilized so as to simultaneously activate the $p^+$ type regions 18. Next, the gate insulating films 25 and the gate electrodes 26 which are the remaining elements of the MIS transistor structures 22 are formed. Thereafter, the interlayer insulating films 30 and the source electrode 4 are formed.

Figure 8E:
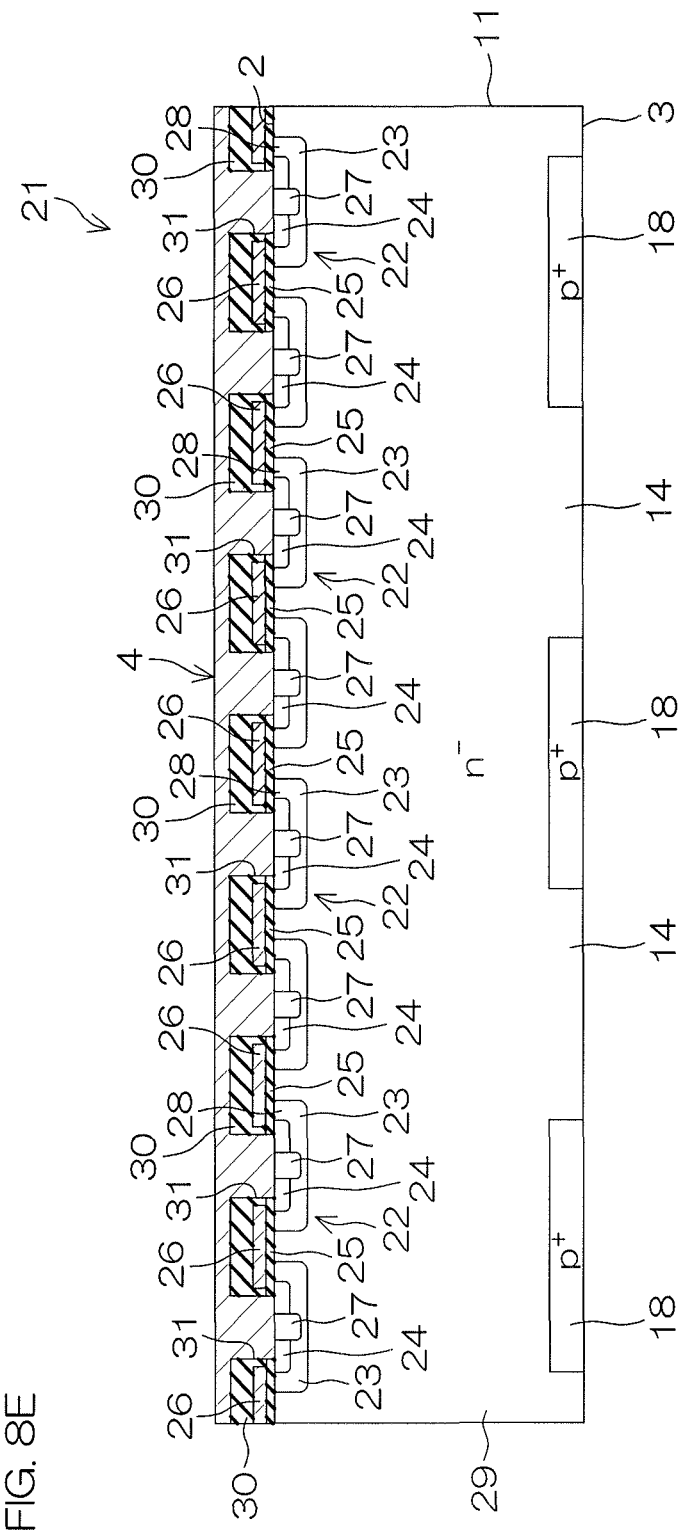
FIG. 8E is a diagram showing a step subsequent to FIG. 8D.

Next, as shown in FIG. 8E, by removing the base substrate 19, the entire back surface 3 of the semiconductor layer 11 is exposed. This step is continued until the $p^+$ type regions 18 are exposed from the back surface 3.

Figure 8F:
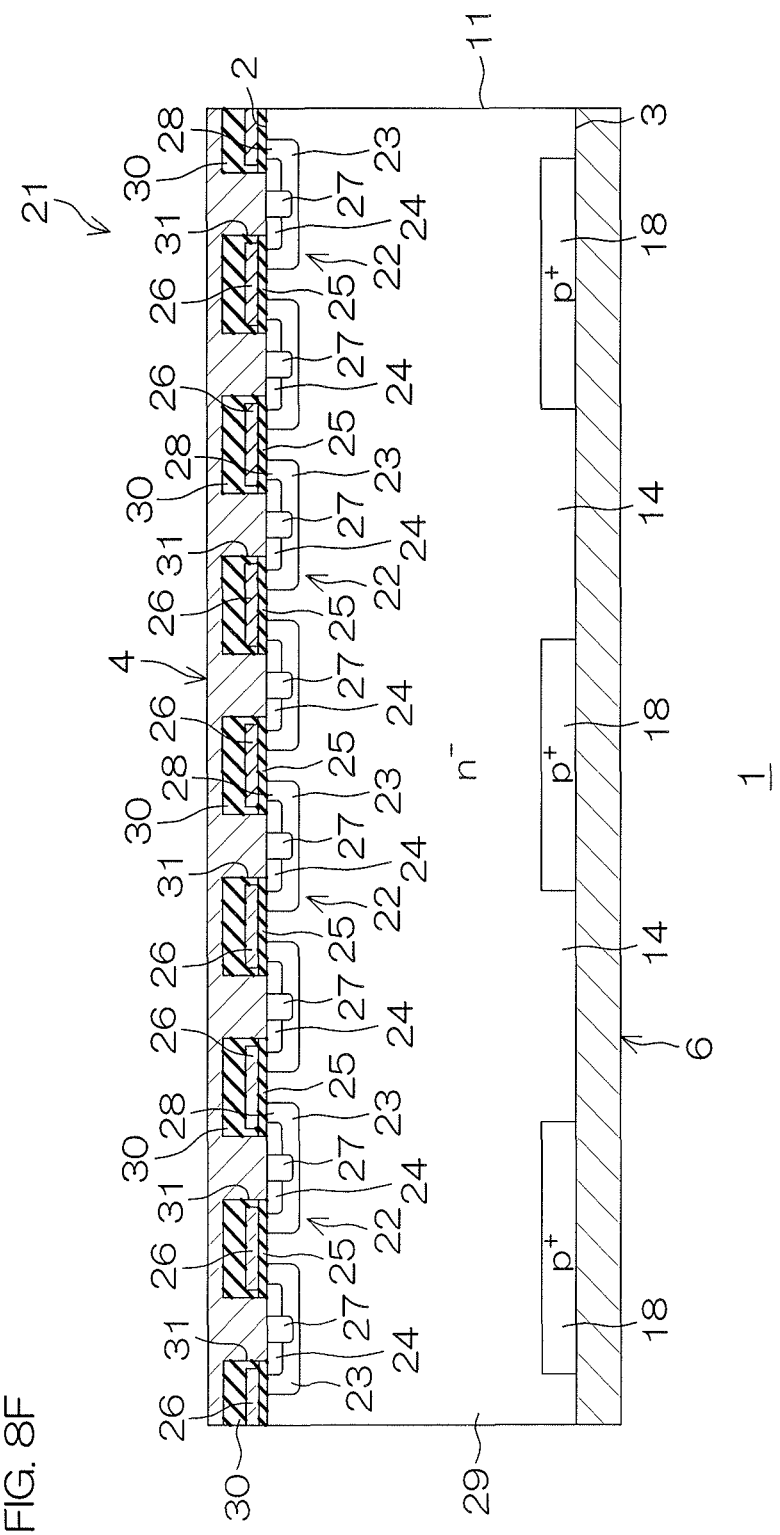
FIG. 8F is a diagram showing a step subsequent to FIG. 8E.

Next, for example, by a sputtering method, a metal film is formed over the entire back surface 3 of the semiconductor layer 11, and the metal film is selectively removed (etched). Accordingly, the drain electrode 6 is formed. Then, the semiconductor layer 11 is cut along a dicing line which is set at a position away from the peripheral edge 10 (not shown in FIG. 8F) of the drain electrode 6. Accordingly, as shown in FIG. 8F, the semiconductor device 1 which is individualized can be obtained.

<Other Forms of the Semiconductor Device 1>

Other forms of the semiconductor device 1 described above will be described below with reference to drawings.

Figure 10:
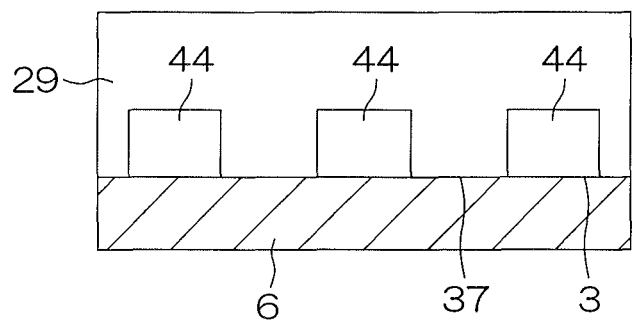
FIG. 10 is an enlarged view of the electric field relaxation regions.
Figure 11:
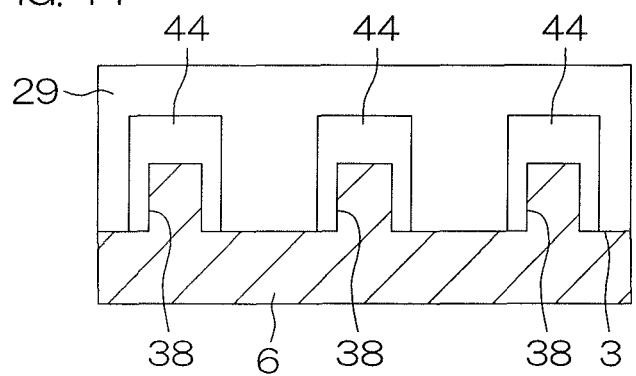
FIG. 11 is an enlarged view of the electric field relaxation regions.

FIG. 9 is a diagram for illustrating electric field relaxation regions 44 formed in a Schottky interface of the back surface 3 of a semiconductor layer 11. Also, FIG. 10 and FIG. 11 are enlarged views of the electric field relaxation regions 44.

The semiconductor device 1 may include the electric field relaxation regions 44 which are formed on the back surface portion of the semiconductor layer 11 in the active region 21 and which are in contact with the drain electrode 6. More specifically, in the $n^-$ type regions 14 (n type drift region 29) exposed from the back surface 3 of the semiconductor layer 11, the electric field relaxation regions 44 are selectively formed.

By forming the electric field relaxation regions 44, an electric field in the Schottky interface between the $n^-$ type drift region 29 and the drain electrode 6 can be relaxed. Accordingly, a reverse leakage current can be reduced even when a metal whose work function is relatively small is used as the drain electrode 6, therefore, by using the metal, a low on-resistance can be ensured. More specifically, although the reverse leakage current can also be reduced at the expense of the low on-resistance, since in this configuration, the reverse leakage current can be reduced by the electric field relaxation regions 44, by using a metal whose work function is lower than a metal used in a case where the electric field relaxation regions 44 are not provided, it is possible to achieve the low on-resistance.

As with the above-described back surface terminal structure 12, the electric field relaxation region 44 may be a high resistance region which has a resistance higher than the n⁻ type drift region 29 or may be a p type impurity region. In a case of the high resistance region, the electric field relaxation region 44 may have a crystal defect concentration of $1 \times 10^{14}$ cm$^{-3}$ to $1 \times 10^{22}$ cm$^{-3}$. On the other hand, in a case of the p type impurity region, the back surface terminal structure 12 may have an impurity concentration of $1 \times 10^{16}$ cm$^{-3}$ to $1 \times 10^{19}$ cm$^{-3}$. By forming the electric field relaxation regions 44 and the back surface terminal structure 12 so as to have the same configuration, they can be formed together in the same step.

Also, as shown in FIG. 10, in a case where the back surface 3 of the semiconductor layer 11 includes a substantially uniform flat portion 37, the electric field relaxation regions 44 may be formed on the flat portion 37. On the other hand, as shown in FIG. 11, in a case where the back surface 3 of the semiconductor layer 11 selectively includes trenches 38, the electric field relaxation regions 44 may be formed within the n⁻ type drift region 29 along the inner surfaces of the trenches 38. In this case, the drain electrode 6 may be embedded in the trenches 38 and be connected to the electric field relaxation regions 44 within the trenches 38.

Figure 12:
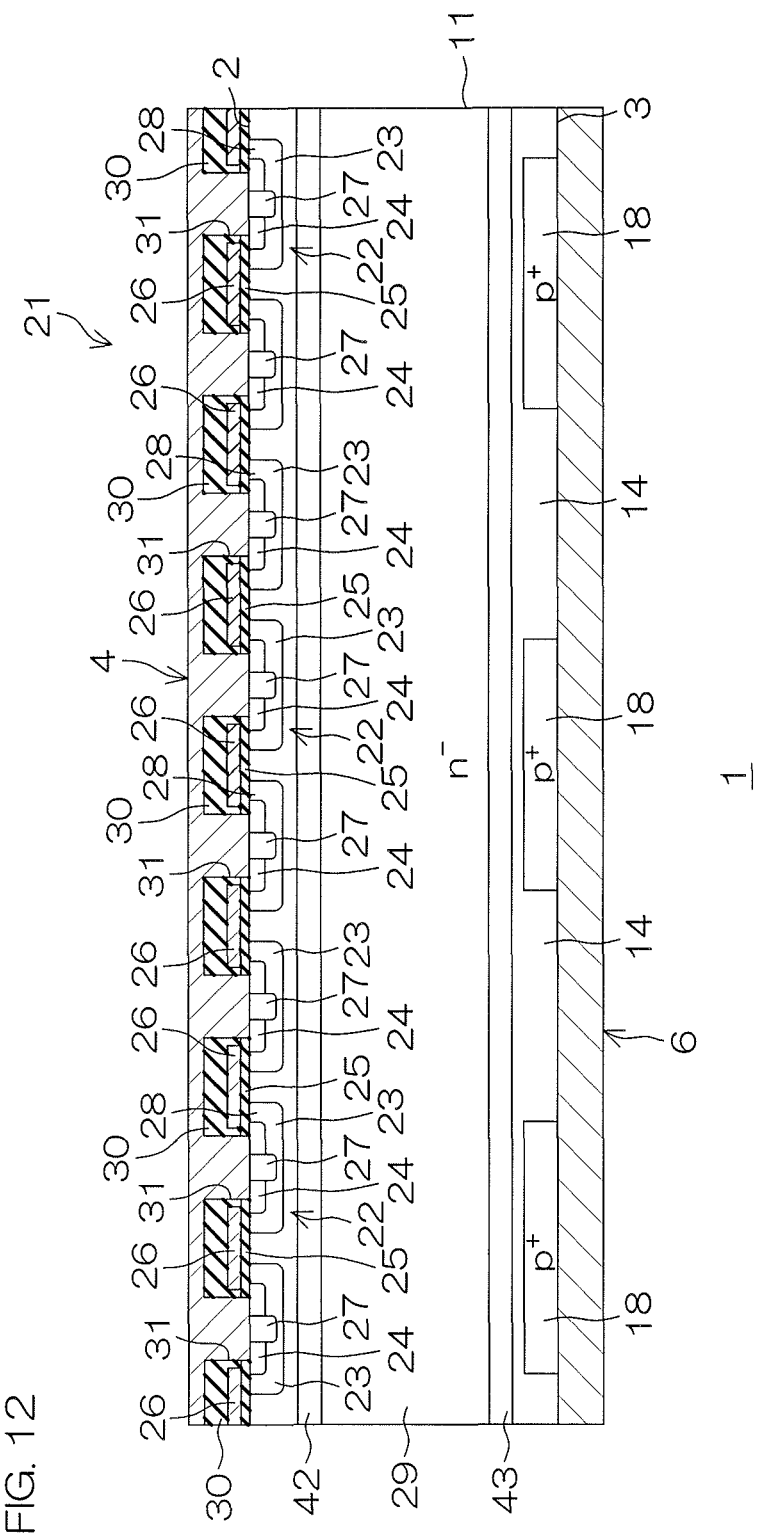
FIG. 12 is a schematic cross-sectional view of a semiconductor device which includes n type field stop regions.
Figure 13:
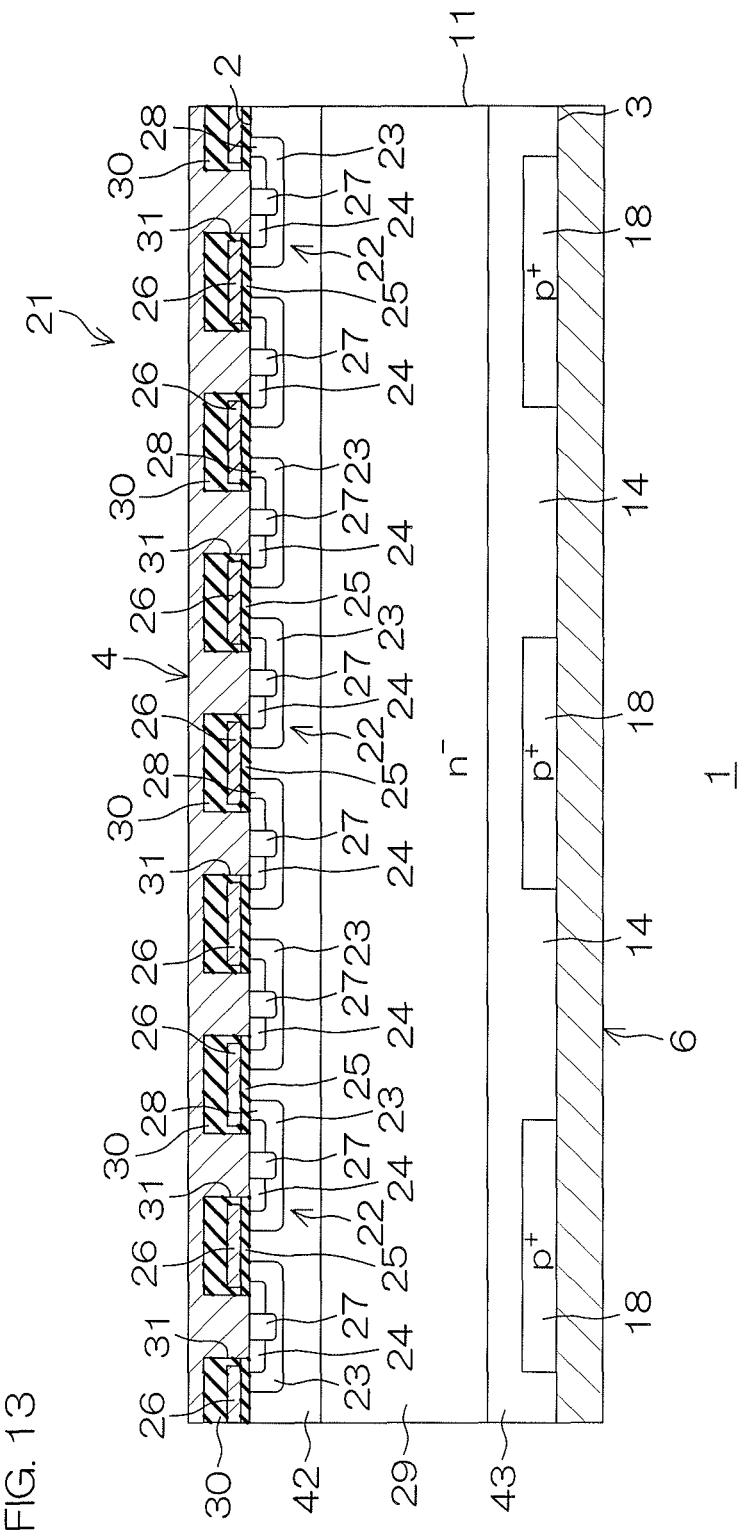
FIG. 13 is a schematic cross-sectional view of the semiconductor device which includes the n type field stop regions.

FIG. 12 and FIG. 13 are schematic cross-sectional views of a semiconductor device 1 which includes n type field stop regions 42 and 43.

By forming the n type field stop regions 42 and 43, when a voltage is applied between the source and the drain, it is possible to prevent a depletion layer extending from a low voltage side from reaching a conductive pattern (for example, the MIS transistor structures 22) on a high voltage side. Accordingly, it is possible to prevent a leakage current caused by a punch-through phenomenon.

The n type field stop regions 42 and 43 suffice to be an n type field stop region which is formed on at least one of the side of the front surface 2 and the side of the back surface 3 of the semiconductor layer 11 and which has an impurity concentration higher than the n⁻ type drift region 29. In FIG. 12 and FIG. 13, both the front surface side n type field stop region 42 and the back surface side n type field stop region 43 are shown.

For example, as shown in FIG. 12, the n type field stop regions 42 and 43 may be arranged at depth positions away from the front surface 2 and the back surface 3 (the Schottky interface) of the semiconductor layer 11.

Specifically, the front surface side n type field stop layer 42 may be disposed below the MIS transistor structure 22 separated toward the side of the back surface 3 from the p type body regions 23. On the other hand, the back surface side n type field stop layer 43 may be disposed at an upper side separated toward the side of the surface 2 from the p⁺ type regions 18.

As shown in FIG. 13, the n type field stop regions 42 and 43 may reach the front surface 2 and the back surface 3 of the semiconductor layer 11.

Impurity concentrations of the n type field stop layers 42 and 43 may have profiles uniform in the depth direction of the semiconductor layer 11, or may have profiles having peaks at predetermined depth positions. In a case where the impurity concentration has a peak, it suffices that a concentration at this peak is higher than a concentration of the n⁻ type drift region 29.

It is noted that, the n type field stop regions 42 and 43 in FIG. 12 and FIG. 13 may be combined as necessary. For example, the front surface side n type field stop region 42 may be arranged in a position away from the front surface 2 of the semiconductor layer 11 whereas the back surface side n type field stop region 43 may reach the back surface 3 of the semiconductor layer 11.

Figure 14:
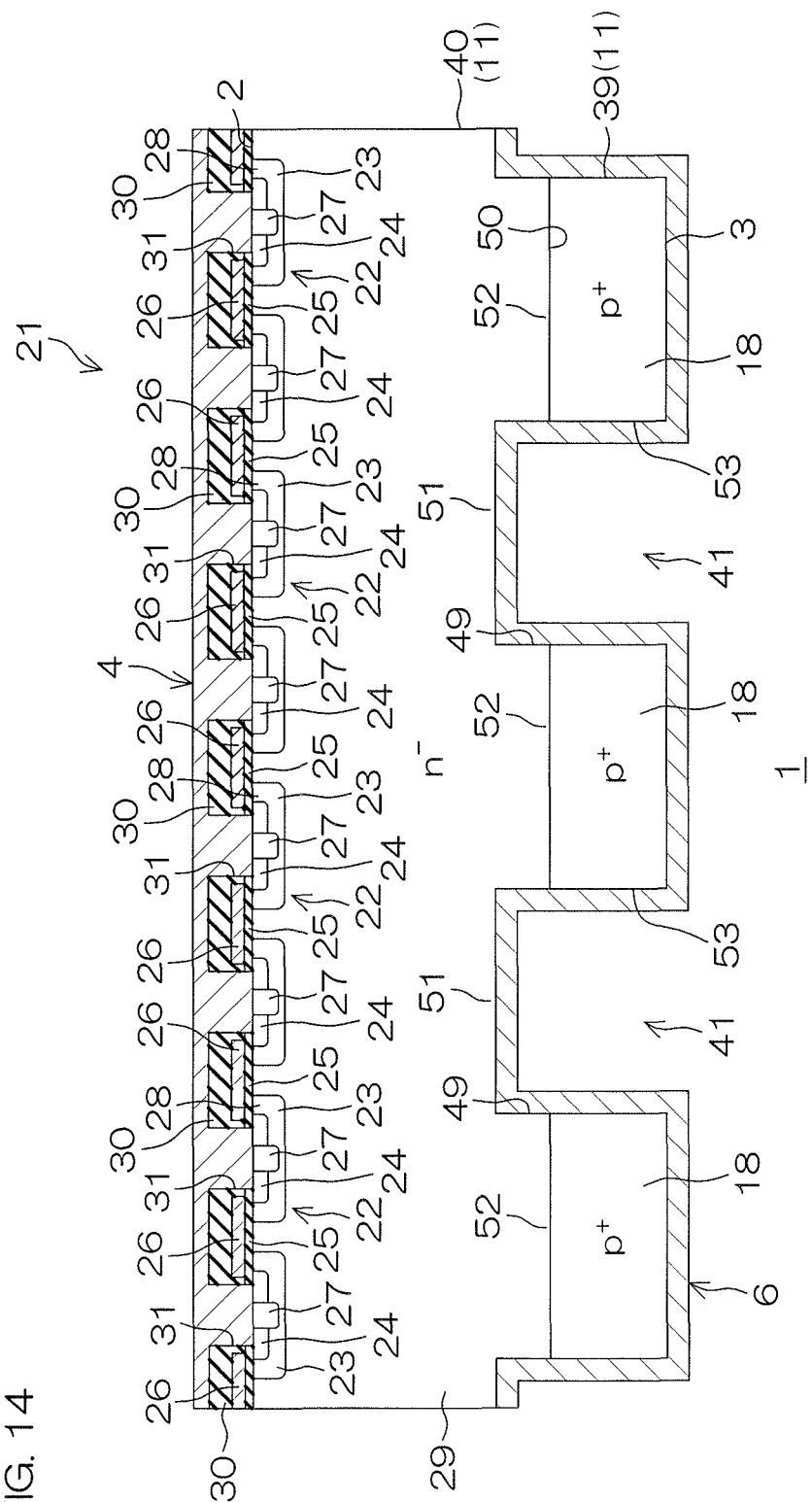
FIG. 14 is a cross-sectional view showing another form of the semiconductor device.

FIG. 14 is a schematic cross-sectional view showing another form of the semiconductor device 1.

Although in the preferred embodiment described above, the p⁺ type regions 18 are formed with the impurity regions selectively formed on the back surface 3 of the n⁺ type semiconductor layer 11, in FIG. 14, the p⁺ type regions 18 are formed with parts of a p⁺ type substrate 39.

More specifically, the semiconductor layer 11 includes the p⁺ type substrate 39 which serves as an example of a second semiconductor layer in the present invention and an n⁻ type semiconductor layer 40 which serves as an example of a first semiconductor layer in the present invention on the p⁺ type substrate 39.

The p⁺ type substrate 39 has, for example, a thickness of 100 μm to 400 μm. Also, the p⁺ type substrate 39 has, for example, an impurity concentration of $1 \times 10^{17}$ cm$^{-3}$ to $5 \times 10^{19}$ cm$^{-3}$.

In the p⁺ type substrate 39, trenches 41 are selectively formed. The respective trenches 41 reach the n⁻ type semiconductor layer 40 from the back surface of the p⁺ type substrate 39 (the back surface 3 of the semiconductor layer 11) and are formed at a greater depth such that the respective trenches 41 form concave portions 49 in the n type semiconductor layer 40. Accordingly, on a back surface 50 of the n⁻ type semiconductor layer 40, steps are formed between the formation positions (first parts 51) of the trenches 41 and the other positions (second parts 52). The bottom portion of the trench 41 is formed only with the n⁻ type semiconductor layer 40 whereas the side portions of the trench 41 are formed with the n⁻ type semiconductor layer 40 and the p⁺ type substrate 39.

The drain electrode 6 is formed along the back surface 3 of the p⁺ type substrate 39 and the inner surfaces of the trenches 41. Accordingly, a distance (the thickness of the drain electrode 6) between one surface which is in contact with the back surface 3 of the p⁺ type substrate 39 of the drain electrode 6 and the inner surface of the trench 41 and the other surface on the side opposite thereto are constant. The drain electrode 6 makes a Schottky junction with the n⁻ type drift region 29 at the bottom portion (the back surface 50) and part of the side portions (side surfaces 53) of the trench 41, and is in ohmic contact with the p⁺ type substrate 39 at part of the side portion (the side surface 53) of the trench 41 and the back surface 3 of the p⁺ type substrate 39.

FIG. 15A to FIG. 15D are diagrams showing a manufacturing process of the semiconductor device 1 shown in FIG. 14 in order of steps.

In order to manufacture the semiconductor device 1 of FIG. 14, as shown in FIG. 15A, first, on the p⁺ type substrate 39 in a state of a wafer, the n⁻ type semiconductor layer 40 is formed by epitaxial growth.

Figure 15B:
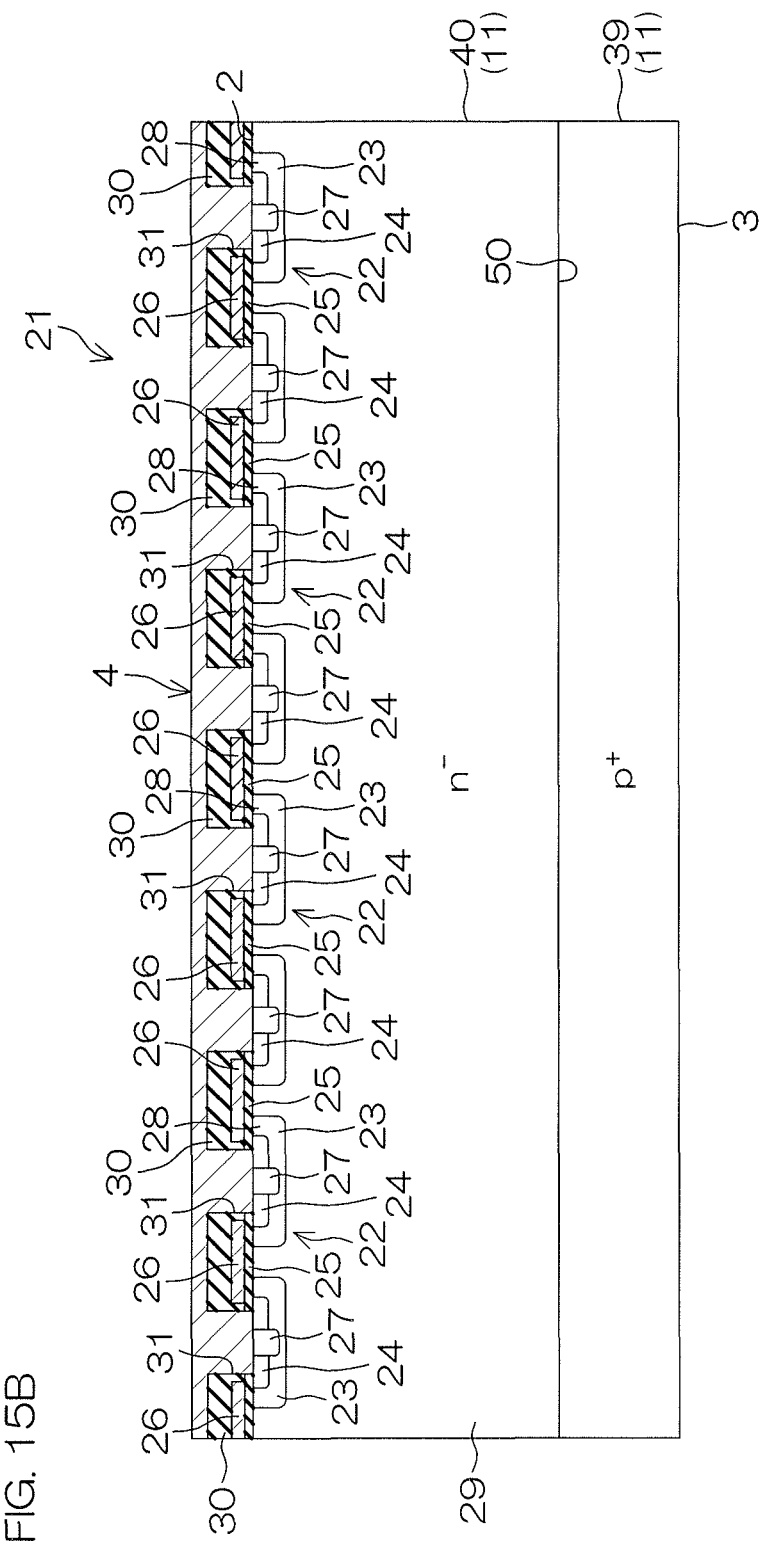
FIG. 15B is a diagram showing a step subsequent to FIG. 15A.

Next, as shown in FIG. 15B, on the front surface portion of the n⁻ type semiconductor layer 40, the MIS transistor structures 22 are formed. Thereafter, the interlayer insulating films 30 and the source electrode 4 are formed.

Figure 15C:
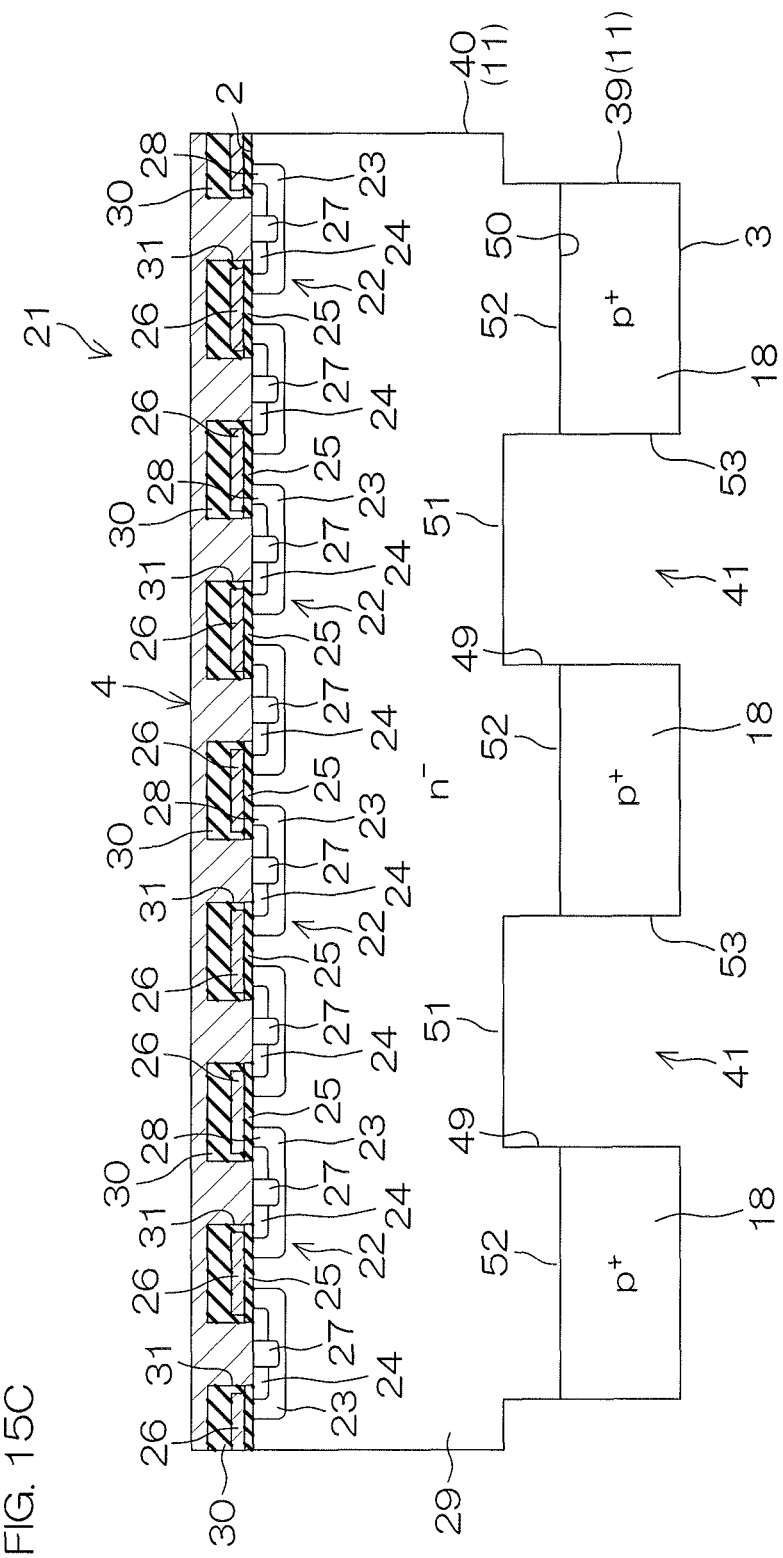
FIG. 15C is a diagram showing a step subsequent to FIG. 15B.

Next, as shown in FIG. 15C, by selectively etching the p+ type substrate 39 from the back surface 3, the trenches 41 which reach the n− type semiconductor layer 40 (the n− type drift region 29) are formed.

It is noted that, prior to the formation of the trenches 41, a step of thinning the p+ type substrate 39 may be performed. By thinning in advance, the etching time can be reduced, and thus the efficiency of the manufacturing can be enhanced. This thinning step may be performed, for example, by thinning the p+ type substrate 39 by grinding from the side of the back surface 3 (for example, grinding by about 50 μm to 300 μm) and thereafter polishing (for example, CMP) may be performed for finishing. In the polishing step, the p+ type substrate 39 remaining after the grinding may be further thinned. By finally applying the polishing step, the surface state of the back surface 3 of the p+ type substrate 39 which is exposed can be made smooth, and thus the drain electrode 6 can be satisfactorily brought into ohmic contact.

Figure 15D:
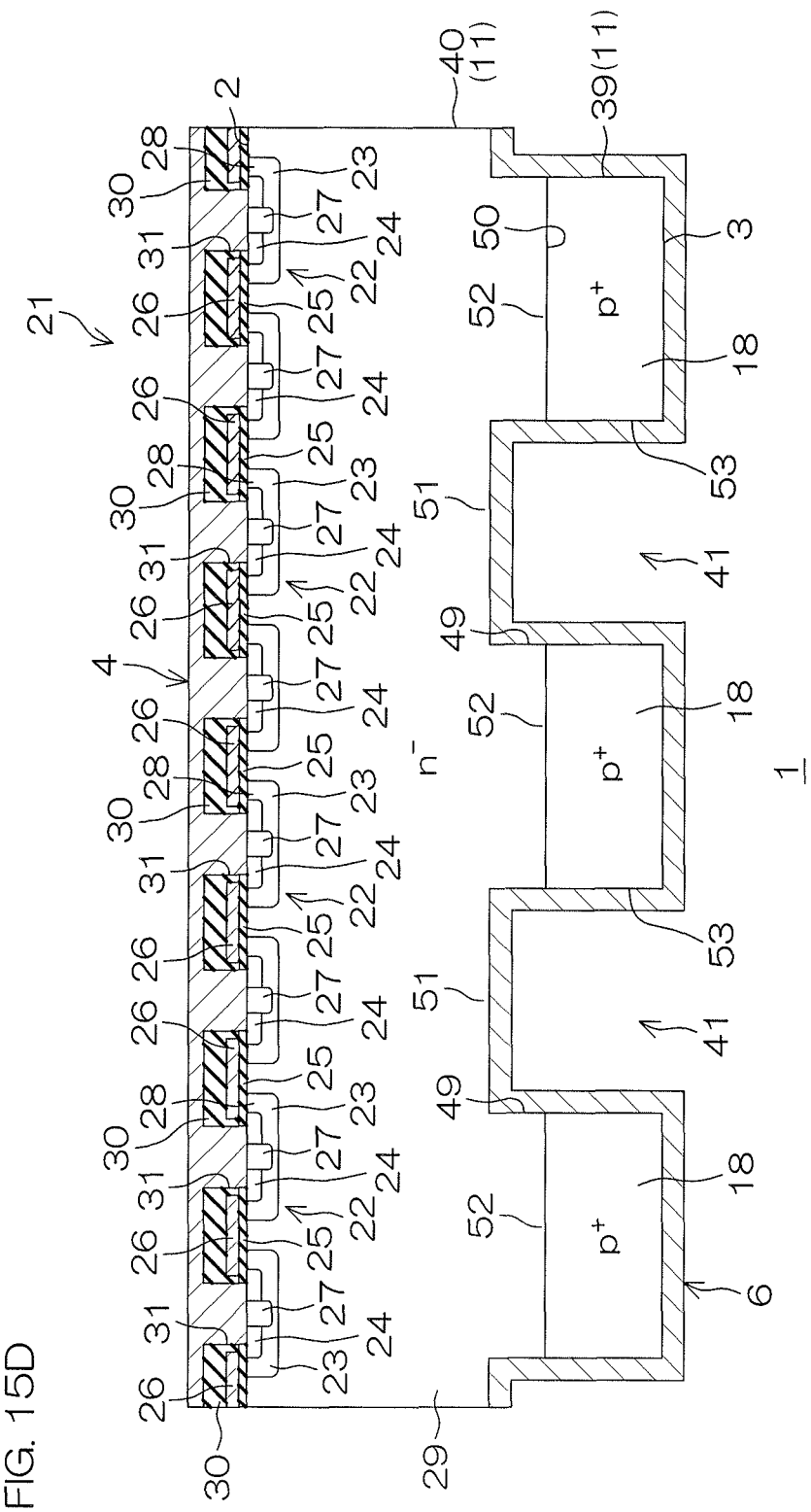
FIG. 15D is a diagram showing a step subsequent to FIG. 15C.

Next, as shown in FIG. 15D, for example, by a sputtering method, a metal film is formed over the entire back surface 3 of the p+ type substrate 39. The metal film is deposited not only on the back surface 3 of the p+ type substrate 39 but also on the inner surfaces of the trenches 41 (the back surface 50 of the n− type semiconductor layer 40 and the side surfaces 53 of the trenches 41). Accordingly, the drain electrode 6 is formed. After the formation of the drain electrode 6, sintering processing may be performed on the drain electrode 6 by laser annealing.

Then, the semiconductor layer 11 is cut along a dicing line which is set in a predetermined position. Accordingly, the semiconductor device 1 which is individualized can be obtained.

Figure 16:
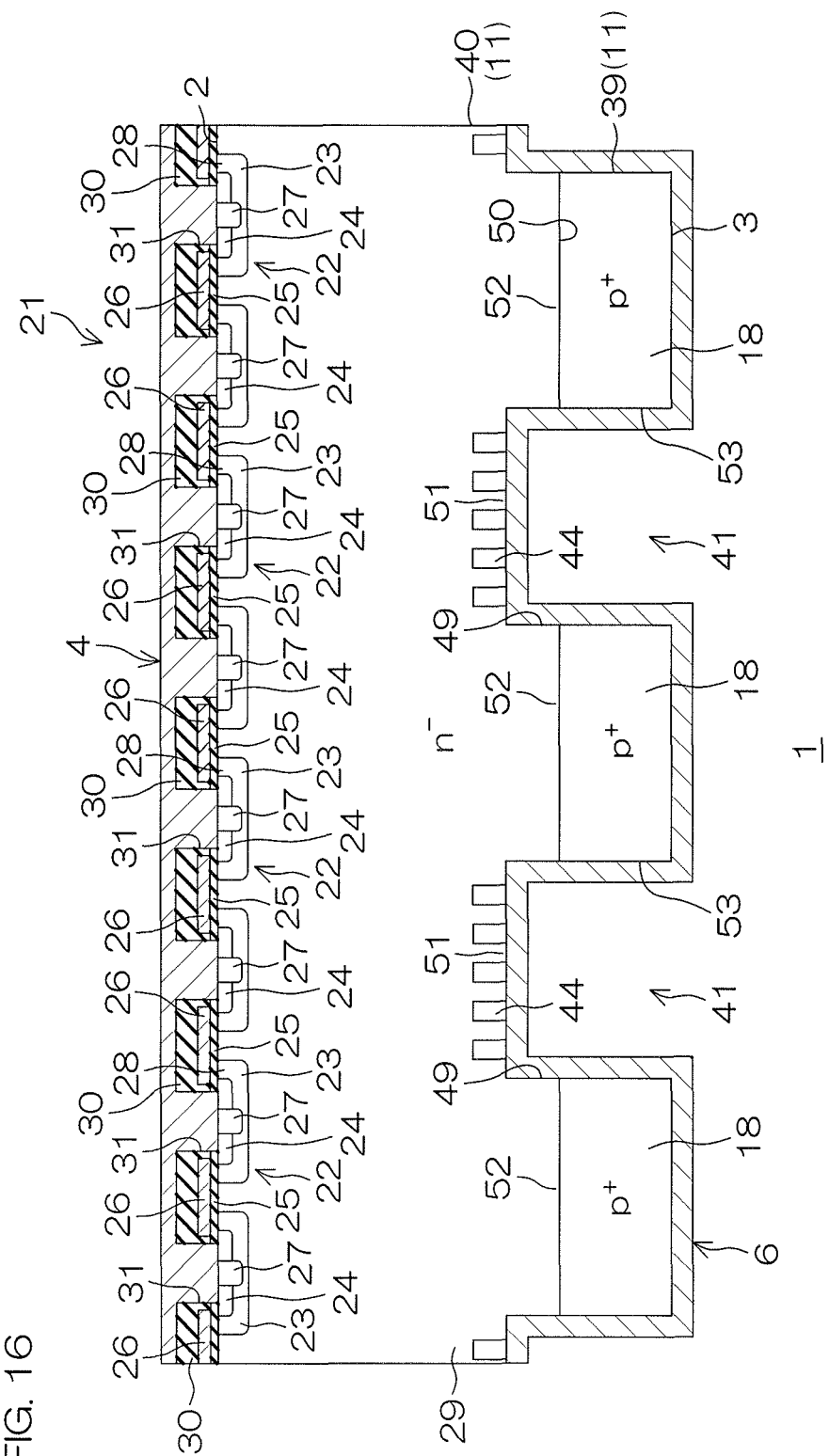
FIG. 16 is a diagram for illustrating electric field relaxation regions formed in a Schottky interface of the semiconductor device in FIG. 14.
Figure 17:
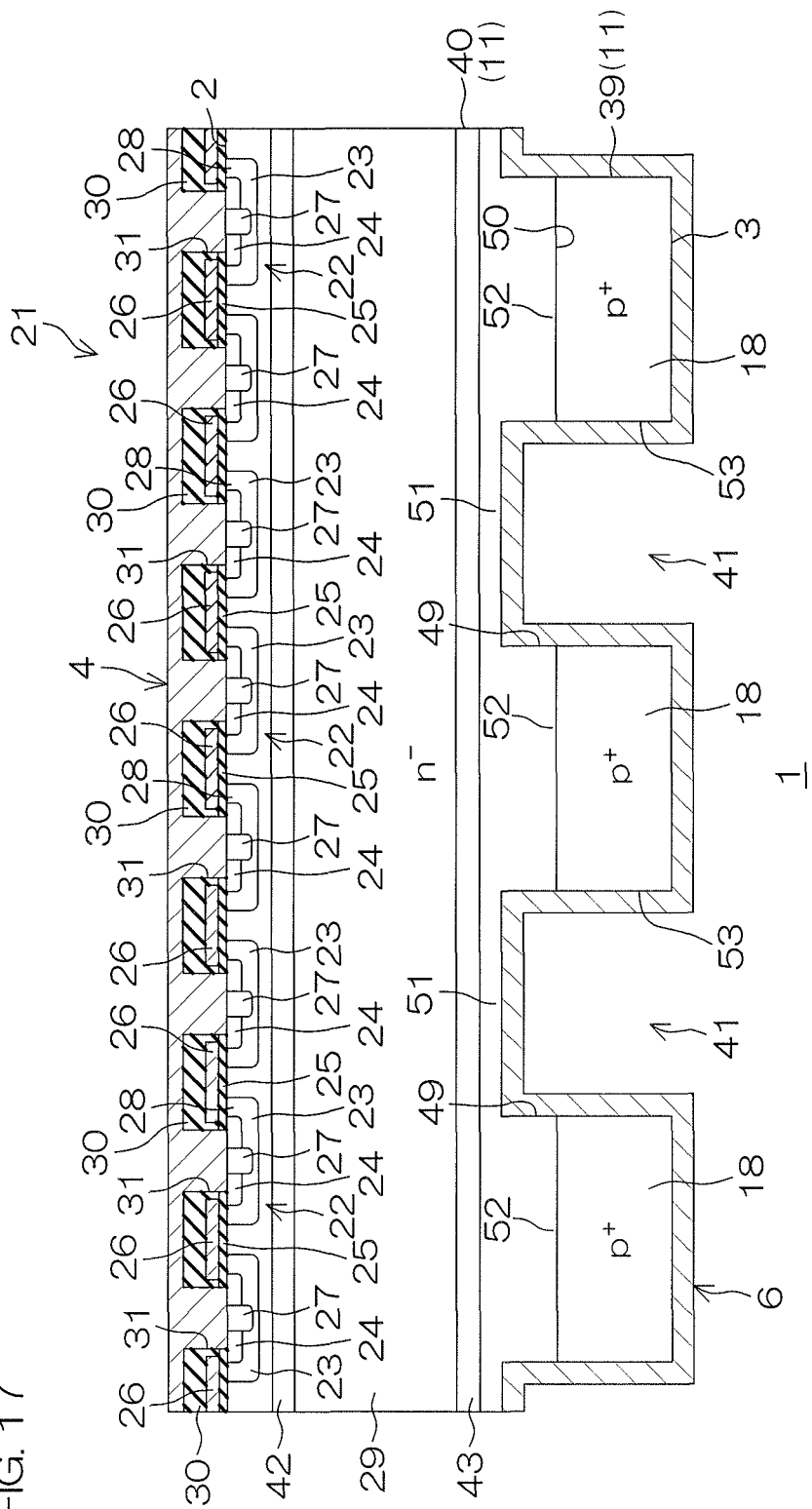
FIG. 17 is a schematic cross-sectional view of a semiconductor device which includes n type field stop regions.
Figure 18:
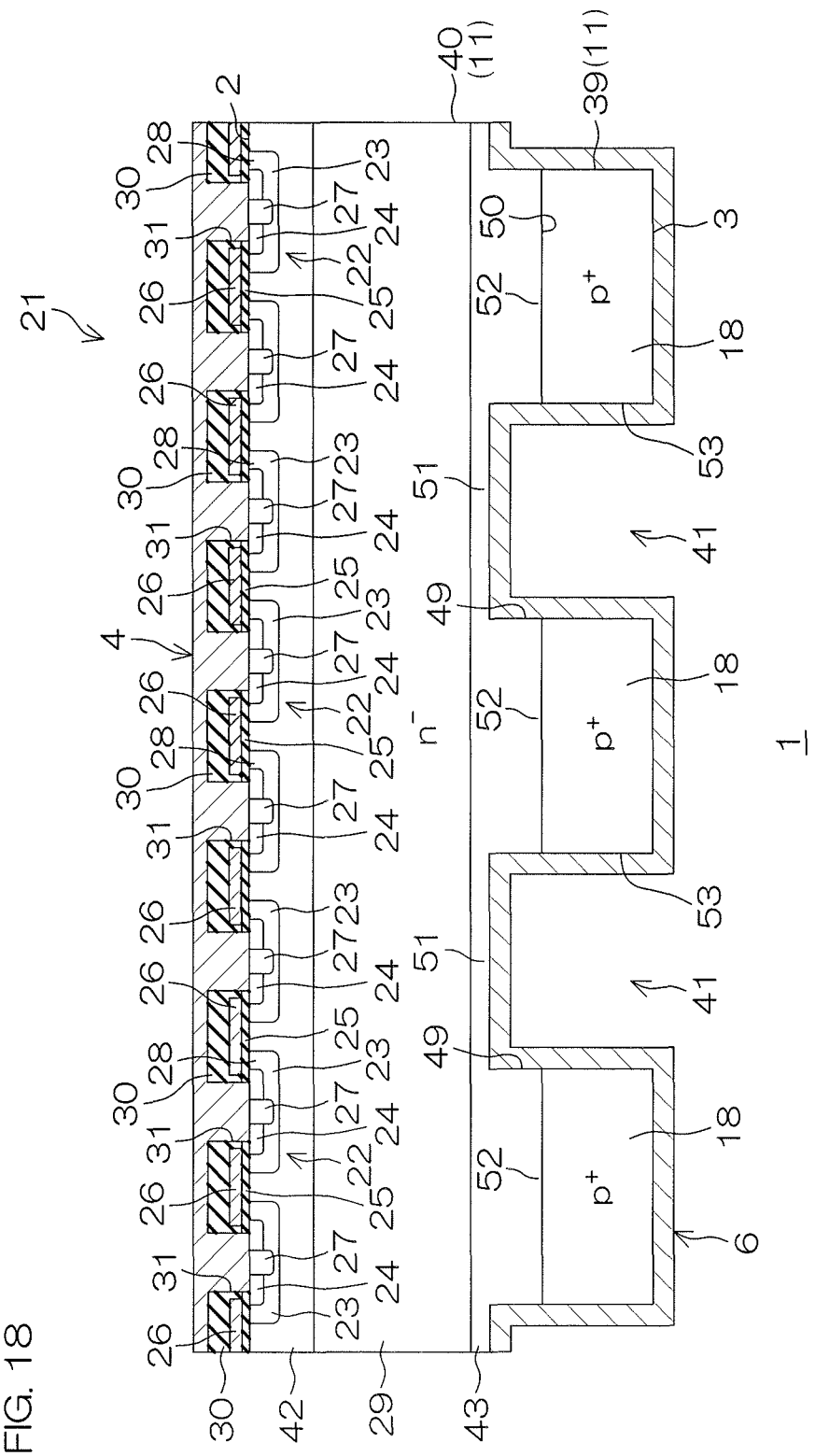
FIG. 18 is a schematic cross-sectional view of the semiconductor device which includes the n type field stop regions.

Even in the semiconductor device 1 of FIG. 14, as shown in FIG. 16 to FIG. 18, the electric field relaxation regions 44 and the n type field stop regions 42 and 43 described above may be provided.

FIG. 16 is a diagram for illustrating the electric field relaxation regions 44 which are formed on the Schottky interface on the back surface 50 of the semiconductor device 1 of FIG. 14. In FIG. 16, the electric field relaxation regions 44 are selectively formed on the first parts 51 of the n− type semiconductor layer 40 which are exposed to the trenches 41.

FIG. 17 and FIG. 18 are schematic cross-sectional views of the semiconductor device which includes the n type field stop regions 42 and 43. As shown in FIG. 17, the n type field stop regions 42 and 43 may be arranged at depth positions away from the front surface 2 and the back surface 3 (the Schottky interface) of the n− type semiconductor layer 40, or, as shown in FIG. 18, the n type field stop regions 42 and 43 may reach the front surface 2 and the back surface 3 (the Schottky interface) of the n− type semiconductor layer 40.

Figure 19:
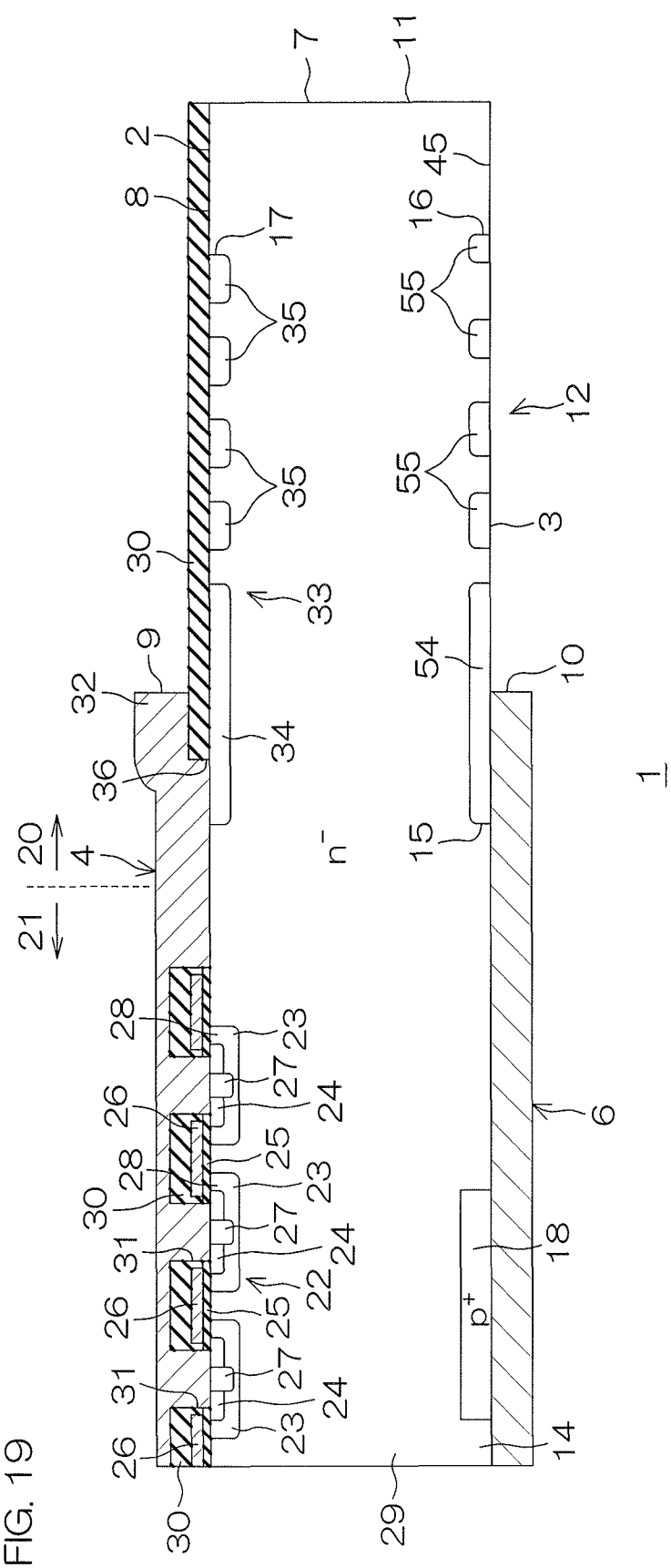
FIG. 19 is a diagram showing another form of a back surface terminal structure in FIG. 4.
Figure 20:
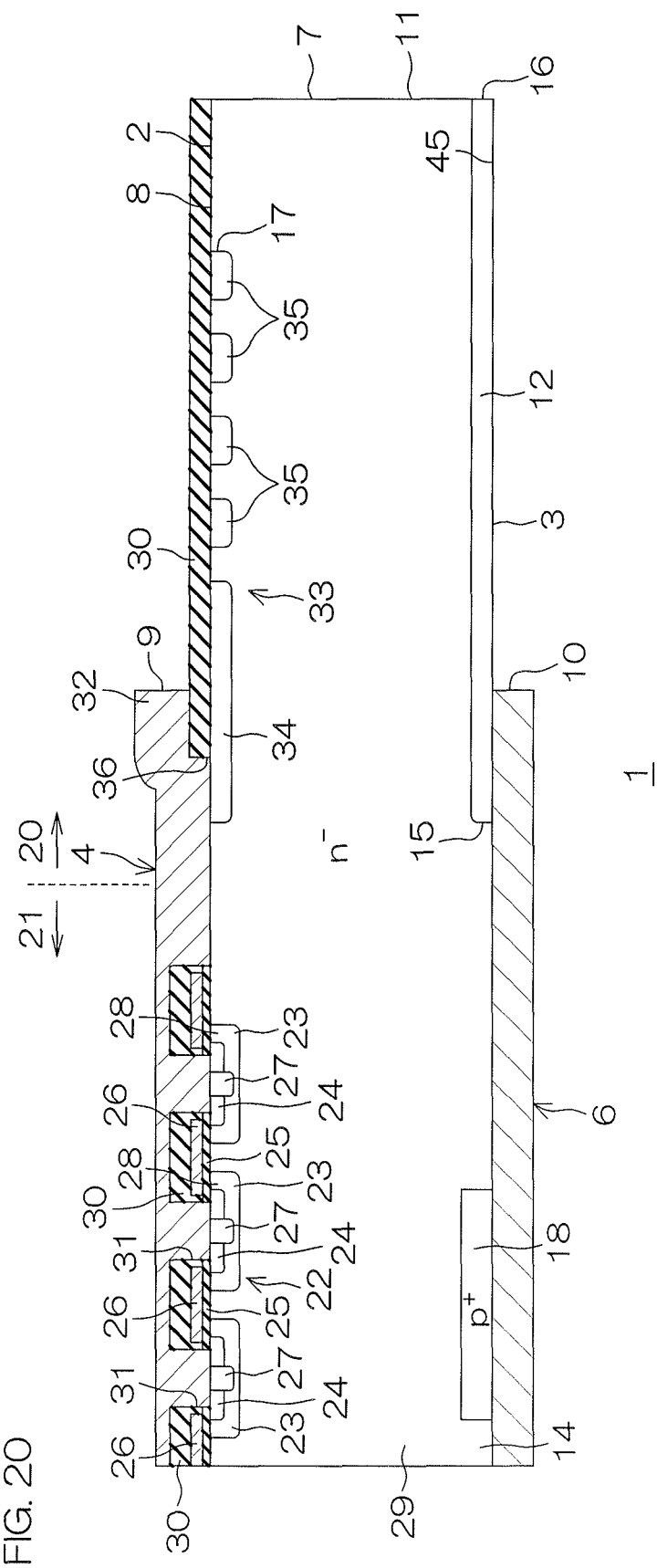
FIG. 20 is a diagram showing another form of the back surface terminal structure in FIG. 4.

FIG. 19 and FIG. 20 are diagrams showing another form of the back surface terminal structure 12 in FIG. 4.

As shown in FIG. 19, the back surface terminal structure 12 may be formed with a plurality of parts which include at least one part that overlaps the peripheral edge portion of the drain electrode 6. In FIG. 19, an innermost resurf layer 54 (RESURF: Reduced Surface Field) and a plurality of guard ring layers 55 which surround the resurf layer 54 are included. The resurf layer 54 is formed such that the resurf layer 54 straddles the interior and the exterior of the drain electrode 6, and is brought into contact with the peripheral edge portion of the drain electrode 6. The plurality of the guard ring layers 55 are spaced from each other. The resurf layer 54 and the guard ring layers 55 may be formed such that the resurf layer 54 and the guard ring layers 55 respec-tively face the resurf layer 34 and the guard ring layers 35 on the front surface terminal structure 33 in a one-to-one relationship.

Also, as shown in FIG. 20, in a case where the back surface terminal structure 12 is the above-described high resistance region, the back surface terminal structure 12 may reach the end surface 7 of the semiconductor layer 11 from the peripheral edge portion of the drain electrode 6. That is, the outer side peripheral edge 16 of the back surface terminal structure 12 may coincide with the end surface 7 of the semiconductor layer 11.

Figure 21:
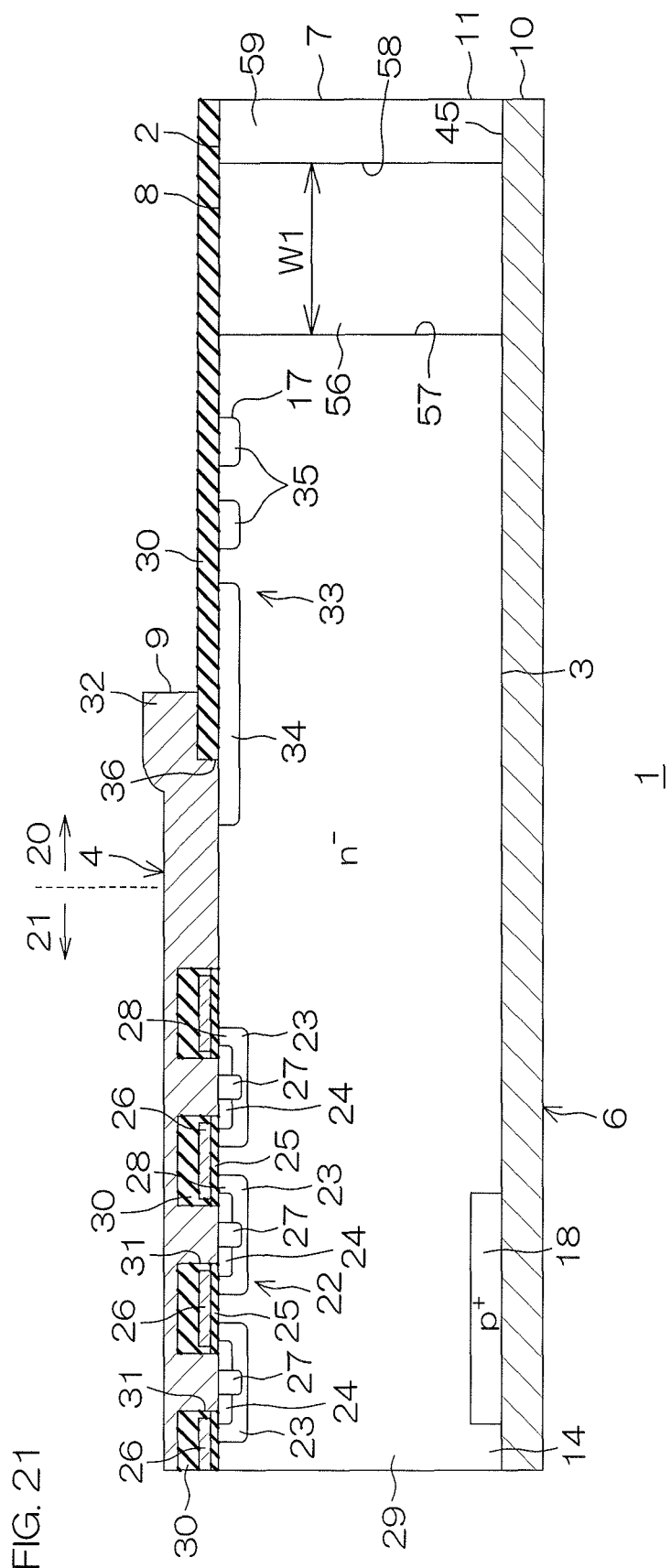
FIG. 21 is a schematic cross-sectional view of a semiconductor device which includes a surrounding electric field relaxation region.

FIG. 21 is a schematic cross-sectional view of a semiconductor device which includes a surrounding electric field relaxation region 56.

In the semiconductor device 1, instead of the back surface terminal structure 12 described above, the surrounding electric field relaxation region 56 may be formed.

The surrounding electric field relaxation region 56 is formed on the outer side of the front surface terminal structure 33 in the outer peripheral region 20. The surrounding electric field relaxation region 56 is formed with either the high resistance region which has a resistance higher than the semiconductor layer 11 (n− type drift region 29) or a p type semiconductor region. For example, in a case where the surrounding electric field relaxation region 56 is the high resistance region, the high resistance region has a crystal defect concentration of $1 \times 10^{14}$ cm$^{-3}$ to $1 \times 10^{22}$ cm$^{-3}$. On the other hand, in a case where the surrounding electric field relaxation region 56 is the p type semiconductor region, the p type semiconductor region has an impurity concentration of $1 \times 10^{18}$ cm$^{-3}$ to $1 \times 10^{22}$ cm$^{-3}$.

The surrounding electric field relaxation region 56 is a constant region which reaches the back surface 3 from the front surface 2 of the semiconductor layer 11. The surrounding electric field relaxation region 56 is formed such that when it is seen in cross section as shown in FIG. 21, an inner side surface 57 close to the active region 21 and an outer side surface 58 on a side opposite thereto are perpendicular to the front surface 2 and the back surface 3. Accordingly, a width W1 of the surrounding electric field relaxation region 56 is substantially constant from the front surface 2 to the back surface 3 of the semiconductor layer 11.

The surrounding electric field relaxation region 56 is spaced inward from the end surface 7 of the semiconductor layer 11, and accordingly, on the outer side of the surrounding electric field relaxation region 56 (between the surrounding electric field relaxation region 56 and the end surface 7 of the semiconductor layer 11), an n− type surrounding region 59 is formed which is formed with part of the semiconductor layer 11 and which serves as an example of a surrounding impurity region in the present invention. The surrounding electric field relaxation region 56 which is annular in plan view surrounds the n− type drift region 29 into a closed space, and the annular region up to the end surface 7 on the outer side thereof is formed as the n− type surrounding region 59.

Figure 22:
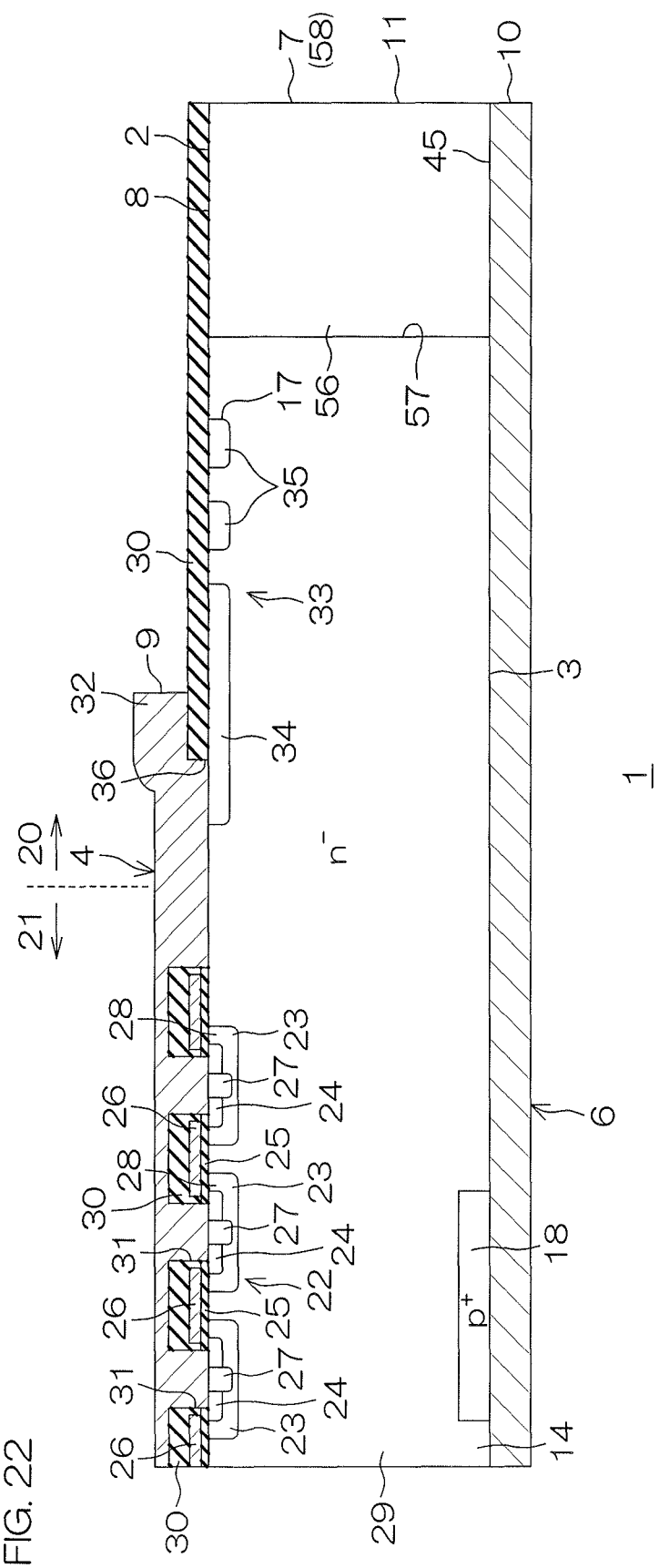
FIG. 22 is a schematic cross-sectional view of the semiconductor device which includes the surrounding electric field relaxation region.

Although the surrounding electric field relaxation region 56 of FIG. 21 is spaced inward from the end surface 7 of the semiconductor layer 11, as shown in FIG. 22, the surrounding electric field relaxation region 56 may reach the end surface 7 of the semiconductor layer 11. Accordingly, the outer side surface 58 of the surrounding electric field relaxation region 56 is the surface which coincides with the end surface 7 of the semiconductor layer 11.

Figure 23:
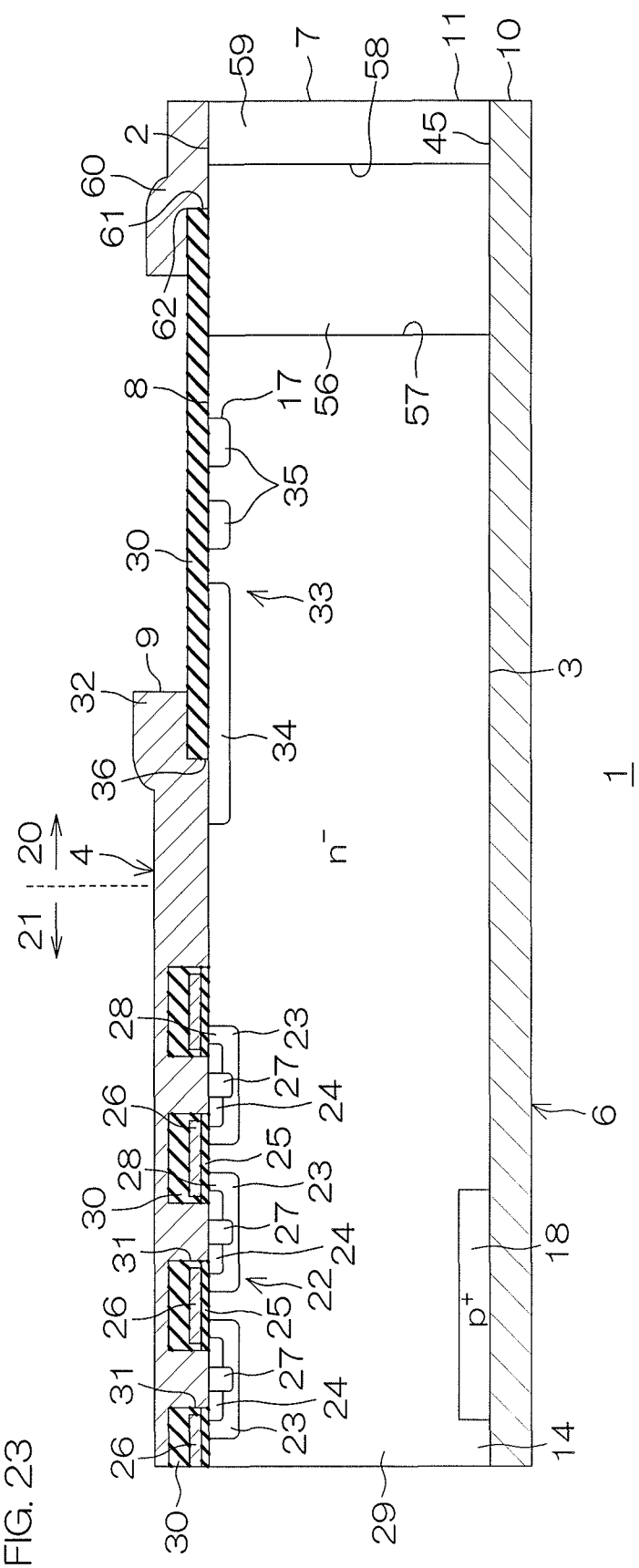
FIG. 23 is a schematic cross-sectional view of the semiconductor device which includes the surrounding electric field relaxation region.

Also, as shown in FIG. 23, the semiconductor device 1 may include a second drain electrode 60 which is formed on the side of the front surface 2 of the semiconductor layer 11 and which serves as an example of an auxiliary electrode in the present invention that is set to have the same potential as the drain electrode 6.

More specifically, in the semiconductor device 1 of FIG. 23, in the interlayer insulating film 30, a contact hole 61 is formed through which the n⁻ type surrounding region 59 and the surrounding electric field relaxation region 56 are exposed at an end portion of the semiconductor layer 11. The contact hole 61 includes an annular inner peripheral edge 62 which surrounds the n⁻ type drift region 29. It is noted that, although in FIG. 23, the contact hole 61 is formed up to the end surface 7 of the semiconductor layer 11 such that the interlayer insulating film 30 is not left near the end surface 7 of the semiconductor layer 11, the contact hole 61 may have an outer peripheral edge in a position separated inward from the end surface 7 such that part of the interlayer insulating film 30 is left near the end surface 7.

The second drain electrode 60 enters the contact hole 61, straddles a boundary portion between the n⁻ type surrounding region 59 and the surrounding electric field relaxation region 56 within the contact hole 61, and makes contact with both the regions 56 and 59. As described with reference to FIG. 22, in a case where the surrounding electric field relaxation region 56 reaches the end surface 7 of the semiconductor layer 11, the second drain electrode 60 may make contact only with the surrounding electric field relaxation region 56 within the contact hole 61.

Figure 24:
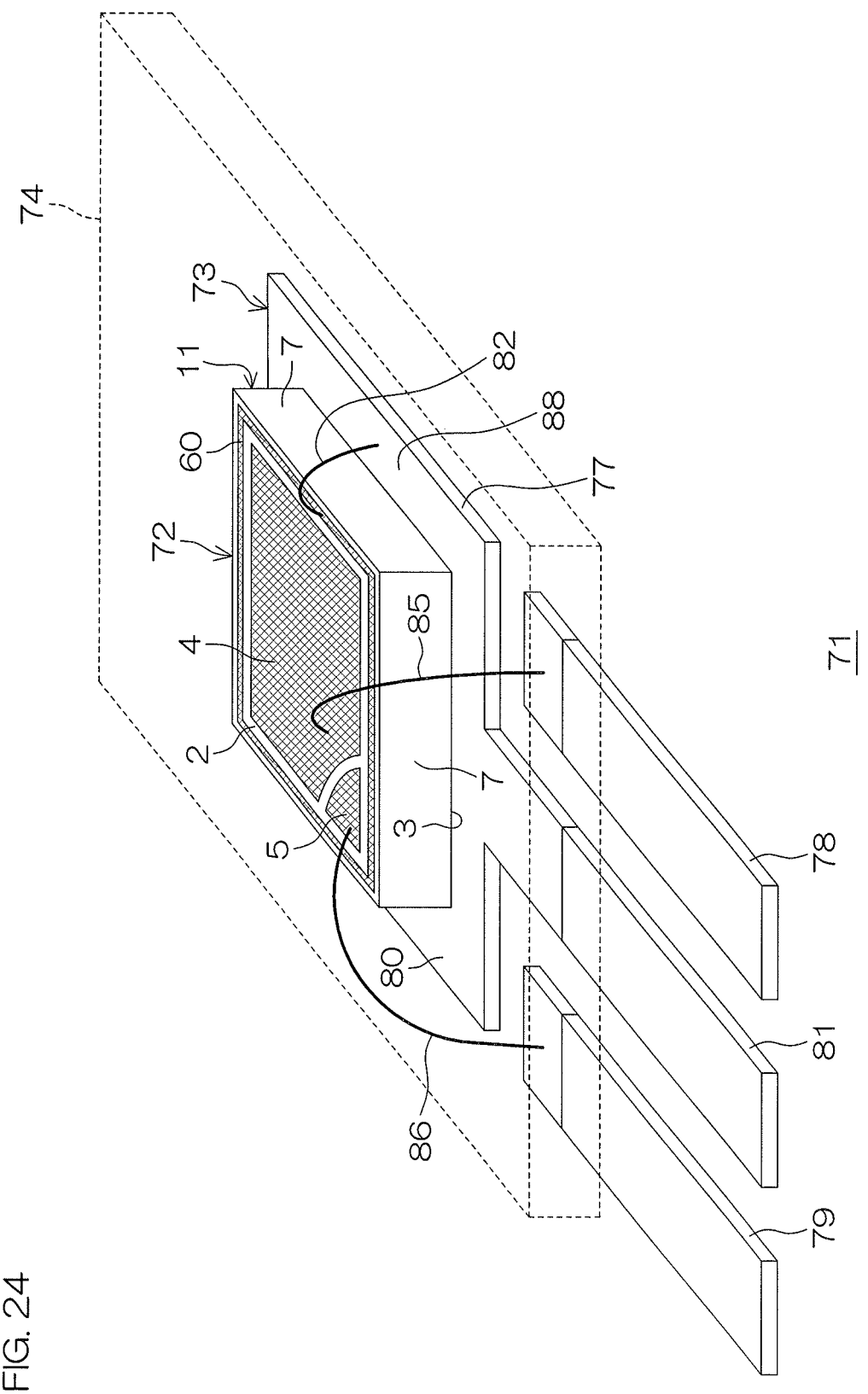
FIG. 24 is a schematic perspective view of a semiconductor package according to a preferred embodiment of the present invention.

Although not shown in FIG. 23, the second drain electrode 60 is electrically connected to the drain electrode 6 (see FIG. 24 for the form of connection of the drain electrode 6 and the second drain electrode 60). Accordingly, the potentials of the n⁻ type surrounding region 59 and the surrounding electric field relaxation region 56 are fixed to the same potential from the front surface 2 of the semiconductor layer 11 in contact with the second drain electrode 60 to the back surface 3 in contact with the drain electrode 6. Consequently, it is possible to make it difficult to extend the electric field to the n⁻ type surrounding region 59 and the surrounding electric field relaxation region 56, and thus it is possible to further relax the intensity of the electric field near the end surface 7 of the semiconductor layer 11.

FIG. 24 is a schematic perspective view of a semiconductor package 71 according to a preferred embodiment of the present invention. In FIG. 24, the same elements as the components in FIG. 1 to FIG. 23 are identified with the same reference signs, and the description thereof will be omitted. Also, in FIG. 24, for clarity, the interior of a resin package 74 is shown by showing the resin package 74 transparent.

The semiconductor package 71 includes a semiconductor chip 72, a substrate terminal 73 which serves as an example of a lead frame in the present invention, and the resin package 74.

The semiconductor chip 72 may have the same configuration as the semiconductor device 1 shown in FIG. 1 to FIG. 23.

The substrate terminal 73 is, for example, a plate (metal substrate) which is formed of a metal material, for example, Cu, etc., and includes a drain terminal 77, a source terminal 78, and a gate terminal 79.

The drain terminal 77 includes an island portion 80 which is formed, in plan view, in the shape of a quadrangle and a linear terminal portion 81 which is extended from one side of the island portion 80. The source terminal 78 and the gate terminal 79 are formed linearly and parallel to the terminal portion 81 of the drain terminal 77, and are respectively arranged on the right side and the left side of the paper surface such that the source terminal 78 and the gate terminal 79 sandwich the drain terminal 77 in the center (terminal portion 81) from both sides in the width direction.

The island portion 80 is provided in order to support the semiconductor chip 72 and has an area larger than the semiconductor chip 72. Accordingly, in a state where the semiconductor chip 72 is mounted, the island portion 80 includes an outer peripheral portion 88 which is part on the outer side of the semiconductor chip 72 and which surrounds the semiconductor chip 72.

The drain electrode (the drain electrode 6 of FIG. 3) of the semiconductor chip 72 is electrically connected to the island portion 80 by die bonding. On the other hand, the source electrode 4 and the gate pad 5 of the semiconductor chip 72 are respectively electrically connected, via bonding wires 85 and 86, to the source terminal 78 and the gate terminal 79. Also, in a case where the semiconductor chip 72 includes the second drain electrode 60 shown in FIG. 23, the second drain electrode 60 is connected to the drain electrode 6 via a bonding wire 82 and the drain terminal 77 (island portion 80). Accordingly, the drain electrode 6 and the second drain electrode 60 can be made to have the same potential.

Although the preferred embodiments of the present invention are described above, the present invention can also be practiced with forms other than the forms described above.

Figure 25:
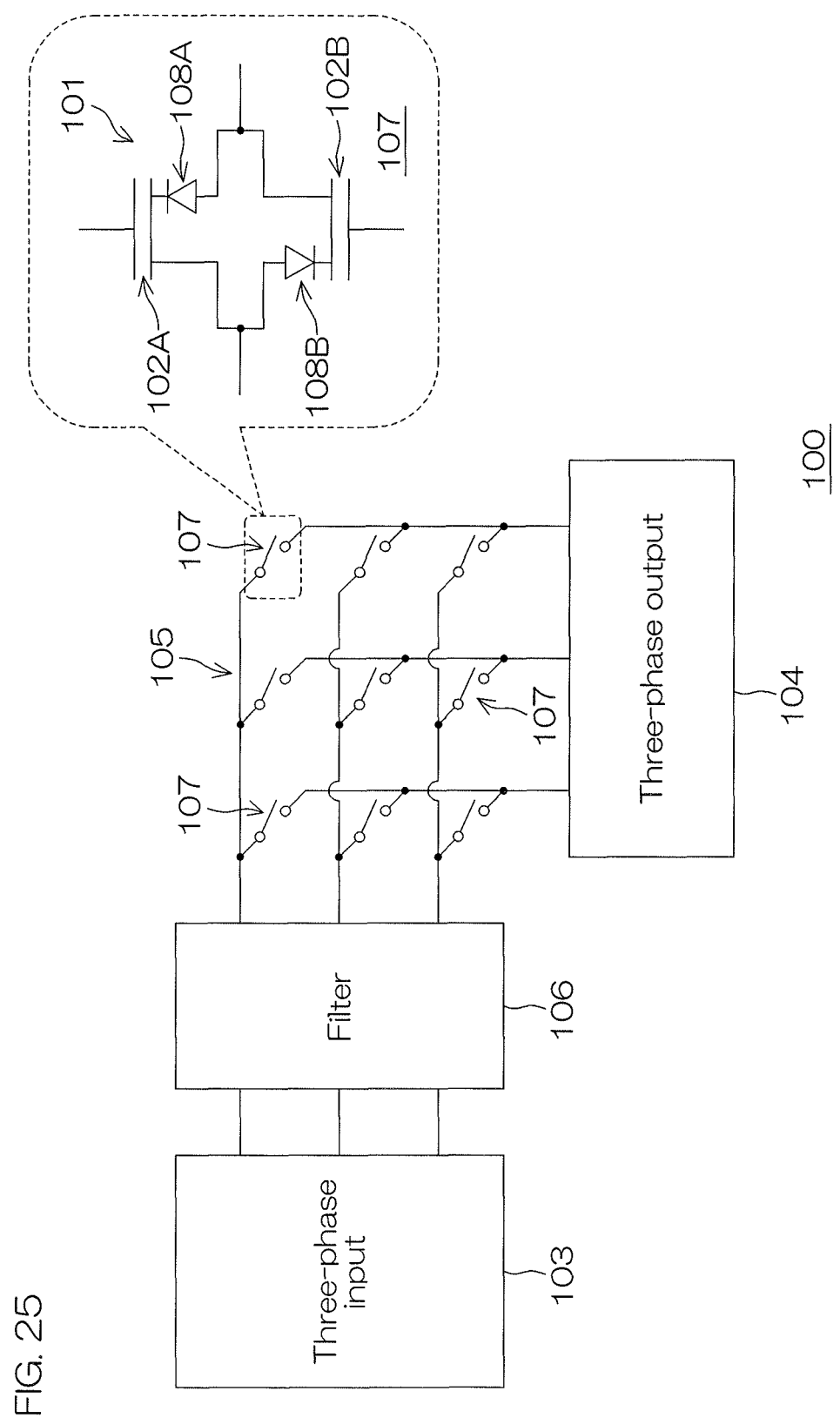
FIG. 25 is a matrix converter circuit diagram in which the semiconductor device according to the preferred embodiment of the present invention is incorporated as a bidirectional switch.

For example, the semiconductor device 1 described above can be incorporated into a matrix converter circuit 100 shown in FIG. 25 as a bidirectional switch. Specifically, the matrix converter circuit 100 includes a three-phase input portion 103, a three-phase output portion 104, a circuit main body portion 105, and a filter circuit 106. The semiconductor device 1 is introduced as a bidirectional switch 101 in each of switch portions 107 in the circuit main body portion 105. The bidirectional switch 101 can be arranged by a combination of two transistors (semiconductor device 1) 102A and 102B and two diodes 108A and 108B.

Figure 26:
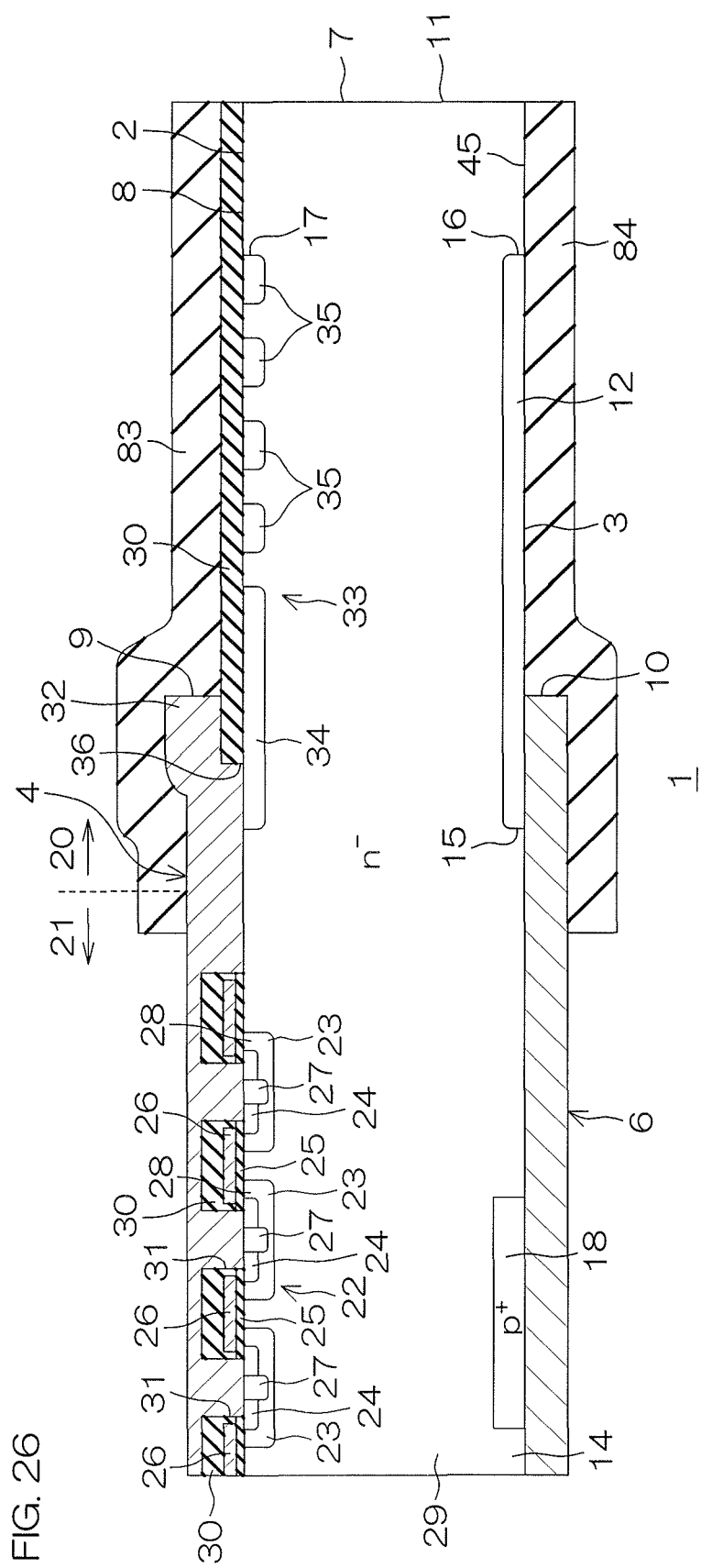
FIG. 26 is a cross-sectional view showing another form of the semiconductor device.

Also, for example, as shown in FIG. 26, the semiconductor device 1 described above may include protective films 83 and 84 which are formed at least in the outer peripheral region 20 of the semiconductor layer 11 and which cover a portion from the peripheral edge portions of the source electrode 4 and the drain electrode 6 to the end surface 7 of the semiconductor layer 11. Only either one of the protective films 83 and 84 may be formed or both thereof may be formed. The terminals of the protective films 83 and 84 do not need to be the end surface 7 of the semiconductor layer 11. The protective films 83 and 84 may be formed of, for example, polyimide. It is noted that, although only the case where the protective films 83 and 84 are applied to the form of FIG. 4 is shown, the protective films 83 and 84 can be, as a matter of course, applied to the forms of FIG. 9, FIG. 12, FIG. 13 and FIG. 14, and FIG. 16 to FIG. 23.

Although in the preferred embodiment described above, only the case where the semiconductor layer 11 is formed of SiC is described, the material of the semiconductor layer 11 may be another material which is referred to as a wide band gap type such as GaN, etc., or the semiconductor layer 11 may be formed of Si. Also, when the semiconductor device of the preferred embodiments in the present invention is used as a bidirectional switch for a power supply device, it is possible to easily obtain a power supply device in which the reliability of withstand voltage is enhanced and in which an on-loss is low.

Besides the above, various design changes can be made within the scope of the matters described in claims.

The present application corresponds to Japanese Patent Application No. 2016-161486 filed in Japan Patent Office on Aug. 19, 2016, and the entire disclosure of the application is incorporated herein by reference.

REFERENCE SIGNS LIST

1 . . . semiconductor device
2 . . . front surface
3 . . . back surface
4 . . . source electrode
6 . . . drain electrode
7 . . . end surface
10 . . . peripheral edge
11 . . . semiconductor layer
12 . . . back surface terminal structure
14 . . . n⁻ type region
15 . . . inner side peripheral edge
16 . . . outer side peripheral edge
18 . . . p⁺ type region
20 . . . outer peripheral region
21 . . . active region
22 . . . MIS transistor structure
23 . . . p type body region
24 . . . n⁺ type source region
25 . . . gate insulating film
26 . . . gate electrode
29 . . . n⁻ type drift region
30 . . . interlayer insulating film
33 . . . front surface terminal structure
34 . . . resurf layer
35 . . . guard ring layer
37 . . . flat portion
38 . . . trench
39 . . . p⁺ type substrate
40 . . . n⁻ type semiconductor layer
41 . . . trench
42 . . . n type field stop region
43 . . . n type field stop region
44 . . . electric field relaxation region
54 . . . resurf layer
55 . . . guard ring layer
56 . . . surrounding electric field relaxation region
59 . . . n⁺ type surrounding region
60 . . . second drain electrode
71 . . . semiconductor package
72 . . . semiconductor chip
73 . . . substrate terminal
74 . . . resin package
100 . . . matrix converter circuit
101 . . . bidirectional switch

The invention claimed is:

1. A semiconductor device comprising:
a semiconductor layer having a front surface, a back surface on a side opposite thereto and an end surface;
an MIS transistor structure which is formed on a front surface portion of the semiconductor layer;
a first conductivity type portion and a second conductivity type portion which are formed adjacent to each other on a side of the back surface of the semiconductor layer; and
a first electrode which is formed on the back surface of the semiconductor layer, which forms a Schottky junction with the first conductivity type portion and which is in ohmic contact with the second conductivity type portion, wherein
the first electrode includes a peripheral edge in a position separated inward from the end surface of the semiconductor layer.

2. The semiconductor device according to claim 1,
wherein the semiconductor layer includes a first conductivity type semiconductor layer,
the first conductivity type portion includes a back surface portion of the first conductivity type semiconductor layer, and
the second conductivity type portion includes a second conductivity type impurity region which is selectively formed on the back surface portion of the first conductivity type semiconductor layer.

3. The semiconductor device according to claim 1,
wherein the semiconductor layer includes a first conductivity type first semiconductor layer and a second conductivity type second semiconductor layer which is formed on a side of a back surface of the first semiconductor layer,
in the second conductivity type layer, a trench having a bottom portion that reaches the first conductivity type layer is selectively formed,
the first conductivity type portion includes a back surface portion of the first conductivity type layer which is exposed to the bottom portion of the trench, and
the second conductivity type portion is formed with the second conductivity type layer.

4. The semiconductor device according to claim 1,
wherein the MIS transistor structure includes a second conductivity type body region, a first conductivity type source region which is formed on a front surface portion of the body region, a gate insulating film which is formed such that the gate insulating film is in contact with at least part of the body region and the source region, a gate electrode which faces the body region across the gate insulating film, an interlayer insulating film which is formed such that the interlayer insulating film covers an upper portion and a side portion of the gate electrode, and a source electrode which is connected to the source region and formed over the interlayer insulating film,
a first conductivity type drift region is arranged on the side of the back surface of the semiconductor layer with respect to the body region in the semiconductor layer, and
the drift region includes a drain region at a region which is connected to the first electrode.

5. The semiconductor device according to claim 4,
wherein the semiconductor layer includes an electric field relaxation region which is selectively formed on a side of a back surface of the first conductivity type portion in an active region where the MIS transistor structure is formed and which is formed with a high resistance region having a resistance higher than the drift region or a second conductivity type impurity region.

6. The semiconductor device according to claim 5,
wherein the semiconductor layer is formed of SiC, and the electric field relaxation region includes a high resistance region which has a crystal defect concentration of $1 \times 10^{14}$ cm$^{-3}$ to $1 \times 10^{22}$ cm$^{-3}$.

7. The semiconductor device according to claim 5,
wherein the semiconductor layer is formed of SiC, and the electric field relaxation region includes a second conductivity type impurity region which has an impurity concentration of $1 \times 10^{16}$ cm$^{-3}$ to $1 \times 10^{19}$ cm$^{-3}$.

8. The semiconductor device according to claim 5,
wherein the first conductivity type portion includes a flat portion which is substantially uniform on the side of the back surface of the semiconductor layer, and the electric field relaxation region is formed in the flat portion.

9. The semiconductor device according to claim 5,
wherein the first conductivity type portion selectively includes the trench on the side of the back surface of the semiconductor layer, and
the electric field relaxation region is formed along an inner surface of the trench.

10. The semiconductor device according to claim 4, further comprising:
a first conductivity type field stop region which is formed on at least a side of the front surface and the side of the back surface of the semiconductor layer and which has an impurity concentration higher than the drift region.

11. The semiconductor device according to claim 10,
wherein the field stop region is arranged at a depth position away from the front surface or the back surface of the semiconductor layer.

12. The semiconductor device according to claim 10,
wherein the field stop region is formed such that the field stop region reaches the front surface or the back surface of the semiconductor layer.

13. The semiconductor device according to claim 1,
wherein the first conductivity type portion has an impurity concentration of $1\times10^{14}$ cm$^{-3}$ to $1\times10^{17}$ cm$^{-3}$, and
the first electrode is formed of Ti, Ni, Mo, or Au.

14. The semiconductor device according to claim 1,
wherein the semiconductor layer further includes a front surface terminal structure which is formed in a surrounding region of the active region where the MIS transistor structure is formed.

15. The semiconductor device according to claim 1,
wherein the semiconductor layer further includes a back surface terminal structure which is formed on the side of the back surface of the semiconductor layer in the surrounding region of the active region where the MIS transistor structure is formed and which is arranged such that the back surface terminal structure overlaps a peripheral edge portion of the first electrode.

16. The semiconductor device according to claim 15,
wherein the back surface terminal structure includes an inner peripheral edge which is on an inner side with respect to the peripheral edge of the first electrode and an outer peripheral edge which is on an outer side with respect to the peripheral edge of the first electrode and which is in a position separated inward from the end surface of the semiconductor layer.

17. The semiconductor device according to claim 15,
wherein the back surface terminal structure is formed with a plurality of parts which include at least one part that overlaps the peripheral edge portion of the first electrode.

18. The semiconductor device according to claim 15,
wherein the back surface terminal structure is formed such that the back surface terminal structure reaches the end surface of the semiconductor layer.

19. A semiconductor device comprising:
a semiconductor layer having a front surface, a back surface on a side opposite thereto and an end surface;
an MIS transistor structure which is formed on a front surface portion of the semiconductor layer;
a first conductivity type portion and a second conductivity type portion which are formed adjacent to each other on a side of the back surface of the semiconductor layer;
a first electrode which is formed on the back surface of the semiconductor layer, which forms a Schottky junction with the first conductivity type portion and which is in ohmic contact with the second conductivity type portion;
a surrounding electric field relaxation region which is formed such that the surrounding electric field relaxation region reaches the back surface from the front surface of the semiconductor layer in the surrounding region of the active region where the MIS transistor structure is formed and which is formed with a high resistance region having a resistance higher than the semiconductor layer or a second conductivity type impurity region; and
an auxiliary electrode being in contact with the surrounding electric field relaxation region on the front surface of the semiconductor layer and electrically connected to the first electrode via the surrounding electric field relaxation region.

20. The semiconductor device according to claim 19,
wherein the semiconductor layer is formed of SiC, and the surrounding electric field relaxation region includes a high resistance region which has a crystal defect concentration of $1\times10^{14}$ cm$^{-3}$ to $1\times10^{22}$ cm$^{-3}$.

21. The semiconductor device according to claim 19,
wherein the semiconductor layer is formed of SiC, and the surrounding electric field relaxation region includes a second conductivity type impurity region which has an impurity concentration of $1\times10^{18}$ cm$^{-3}$ to $1\times10^{22}$ cm$^{-3}$.

22. The semiconductor device according to claim 19,
wherein the surrounding electric field relaxation region is formed such that the surrounding electric field relaxation region is spaced inward from the end surface of the semiconductor layer and to surround the active region.

23. The semiconductor device according to claim 22,
wherein the semiconductor layer includes a first conductivity type surrounding impurity region between the surrounding electric field relaxation region and the end surface of the semiconductor layer,
the first electrode is in contact with the surrounding impurity region on the back surface of the semiconductor layer, and
the auxiliary electrode is in contact with the surrounding impurity region on the front surface of the semiconductor layer.

24. The semiconductor device according to claim 23,
wherein the auxiliary electrode is formed such that the auxiliary electrode straddles a boundary portion between the surrounding electric field relaxation region and the surrounding impurity region, and is in contact with both the surrounding electric field relaxation region and the surrounding impurity region.

25. The semiconductor device according to claim 19,
wherein the surrounding electric field relaxation region is formed such that the surrounding electric field relaxation region reaches the end surface of the semiconductor layer.

26. The semiconductor device according to claim 1,
wherein a plurality of the second conductivity type portions are arranged in a shape of stripes in plan view.

27. The semiconductor device according to claim 1,
wherein the plurality of the second conductivity type portions are respectively formed in a shape of a polygon or in a shape of a circle in plan view and arranged discretely.

28. A semiconductor package comprising:
the semiconductor device according to claim 1;

a lead frame on which the semiconductor device is mounted; and a sealing resin which seals at least part of the semiconductor device and the lead frame.

29. A power conversion device, wherein the semiconductor device according to claim 1 is used as a bidirectional switch.

30. The power conversion device according to claim 29, wherein the bidirectional switch is used as a switch circuit of a matrix converter circuit which converts from a polyphase input to a polyphase output.

31. The semiconductor device according to claim 1, further comprising a second electrode formed on the front surface of the semiconductor layer, the second electrode being electrically connected to the MIS transistor structure and having a peripheral edge facing the peripheral edge of the first electrode.

* * * * *